US008481959B2

(12) United States Patent
Ruffell

(10) Patent No.: US 8,481,959 B2
(45) Date of Patent: *Jul. 9, 2013

(54) APPARATUS AND METHOD FOR MULTI-DIRECTIONALLY SCANNING A BEAM OF CHARGED PARTICLES

(76) Inventor: John Ruffell, Sunnyvale, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 13/028,188

(22) Filed: Feb. 15, 2011

(65) Prior Publication Data

US 2011/0186747 A1 Aug. 4, 2011

Related U.S. Application Data

(62) Division of application No. PCT/US2009/054095, filed on Aug. 17, 2009.

(60) Provisional application No. 61/089,362, filed on Aug. 15, 2008, provisional application No. 61/089,378, filed on Aug. 15, 2008.

(51) Int. Cl.
*H01J 37/256* (2006.01)
*H01J 3/14* (2006.01)
*H01J 3/18* (2006.01)
*H01J 3/26* (2006.01)

(52) U.S. Cl.
USPC ............ 250/396 R; 250/396 ML; 250/398; 250/400; 250/492.2; 250/492.1

(58) Field of Classification Search
USPC .......... 250/396 R, 396 ML, 398, 400, 492.1, 250/492.2
See application file for complete search history.

(56) References Cited

U.S. PATENT DOCUMENTS

| 4,281,251 | A | 7/1981 | Thompson et al. |
| 4,295,048 | A | 10/1981 | Cleland et al. |
| 6,005,247 | A | 12/1999 | Baum |
| 6,420,700 | B2 | 7/2002 | Ooaeh et al. |
| 6,433,347 | B1 | 8/2002 | Suzuki |
| 6,617,586 | B2 | 9/2003 | Woodburn et al. |
| 6,633,046 | B1 | 10/2003 | Mitchell et al. |
| 6,777,695 | B2 | 8/2004 | Viviani |
| 6,791,094 | B1 | 9/2004 | Olson et al. |
| 7,435,956 | B2 | 10/2008 | Parker |
| 7,436,177 | B2 * | 10/2008 | Gorrell et al. ................. 324/317 |
| 7,566,888 | B2 * | 7/2009 | Swenson .................... 250/492.3 |
| 7,863,564 | B2 | 1/2011 | Tsuneta et al. |
| 7,875,858 | B2 | 1/2011 | Ito et al. |
| 2005/0035306 | A1 | 2/2005 | Iwasaki |
| 2011/0186747 | A1 | 8/2011 | Ruffell |
| 2011/0186748 | A1* | 8/2011 | Ruffell .......................... 250/400 |

OTHER PUBLICATIONS

PCT/US09/54095 International Search Report & Written Opinion mailed Mar. 31, 2010, 12 pages.

(Continued)

*Primary Examiner* — Nikita Wells
(74) *Attorney, Agent, or Firm* — Lathrop & Gage LLP

(57) ABSTRACT

Systems and methods of an ion implant apparatus include an ion source for producing an ion beam along an incident beam axis. The ion implant apparatus includes a beam deflecting assembly coupled to a rotation mechanism that rotates the beam deflecting assembly about the incident beam axis and deflects the ion beam. At least one wafer holder holds target wafers and the rotation mechanism operates to direct the ion beam at one of the at least one wafer holders which also rotates to maintain a constant implant angle.

21 Claims, 27 Drawing Sheets

OTHER PUBLICATIONS

U.S. Appl. No. 13/028,190 Nonfiled Office Action mailed Jun. 20, 2012, 5 pages.
U.S. Appl. No. 13/059,229 Nonfinal Office Action mailed Jul. 6, 2012, 9 pages.
U.S. Appl. No. 13/028,190 Response to Office Action filed Sep. 20, 2012, 17 pages.
U.S. Appl. No. 13/028,190 Notice of Allowance mailed Nov. 5, 2012, 8 pages.
U.S. Appl. No. 13/059,229 Response to Office Action filed Jan. 7, 2013, 27 pages.

* cited by examiner

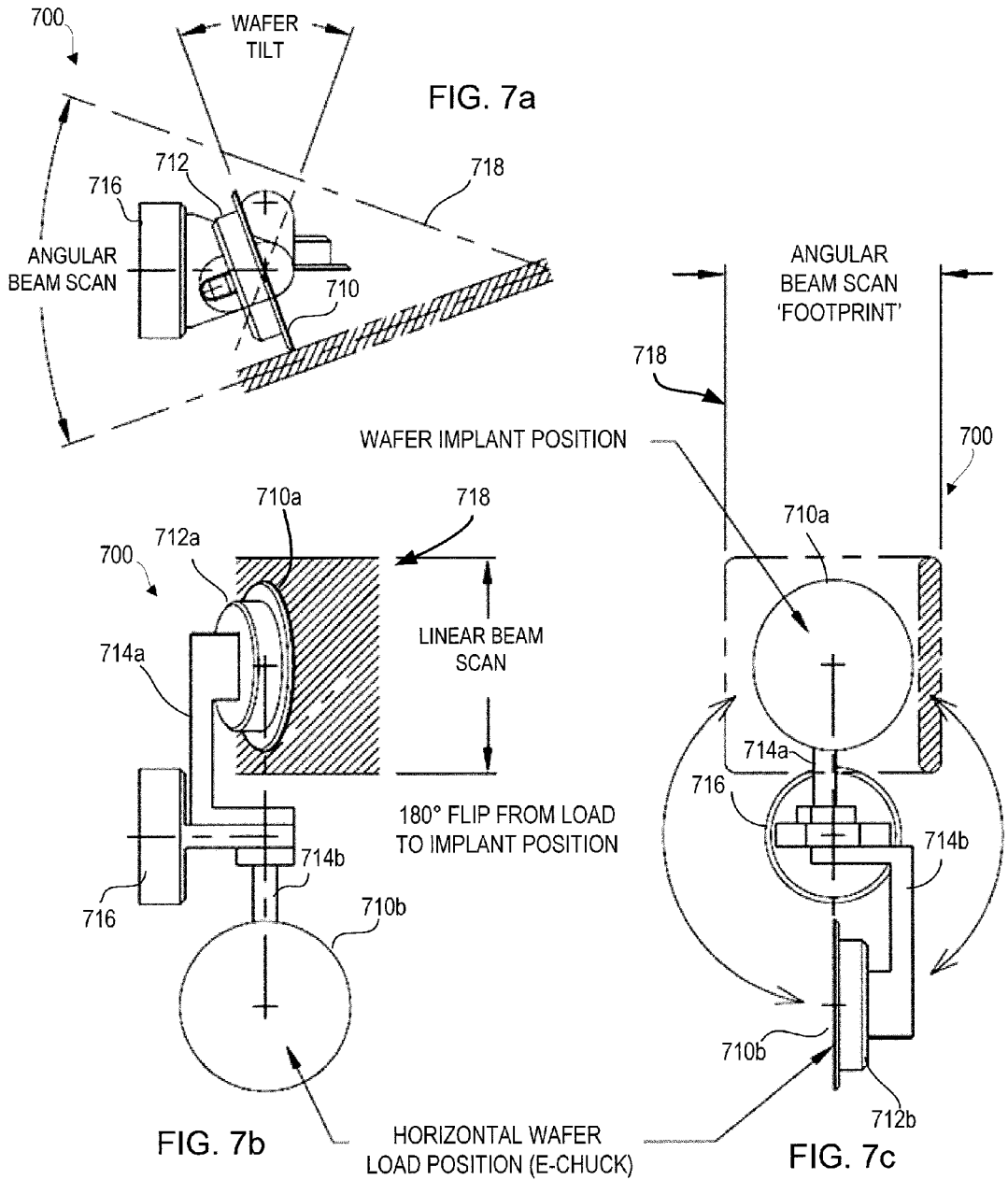

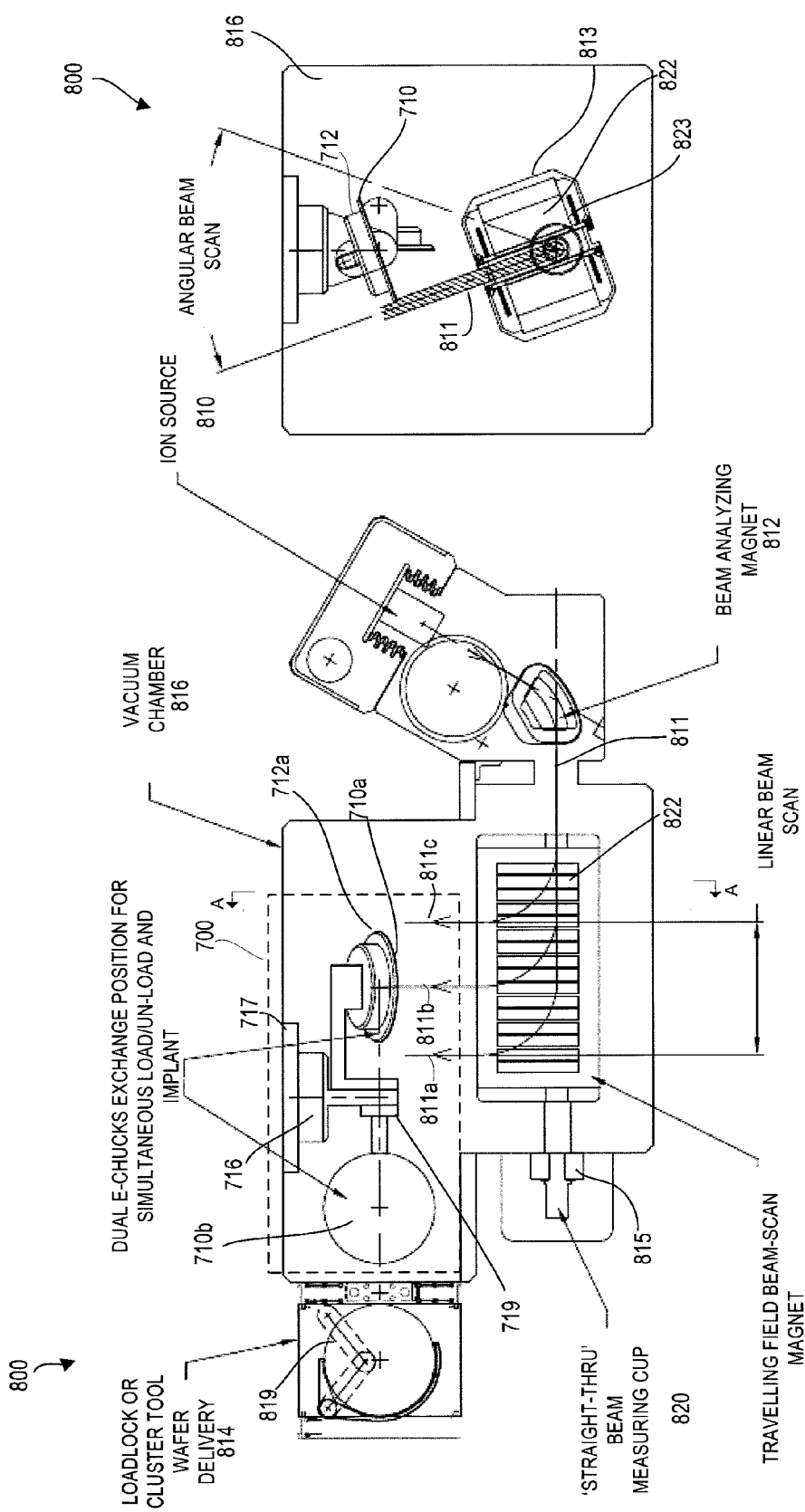

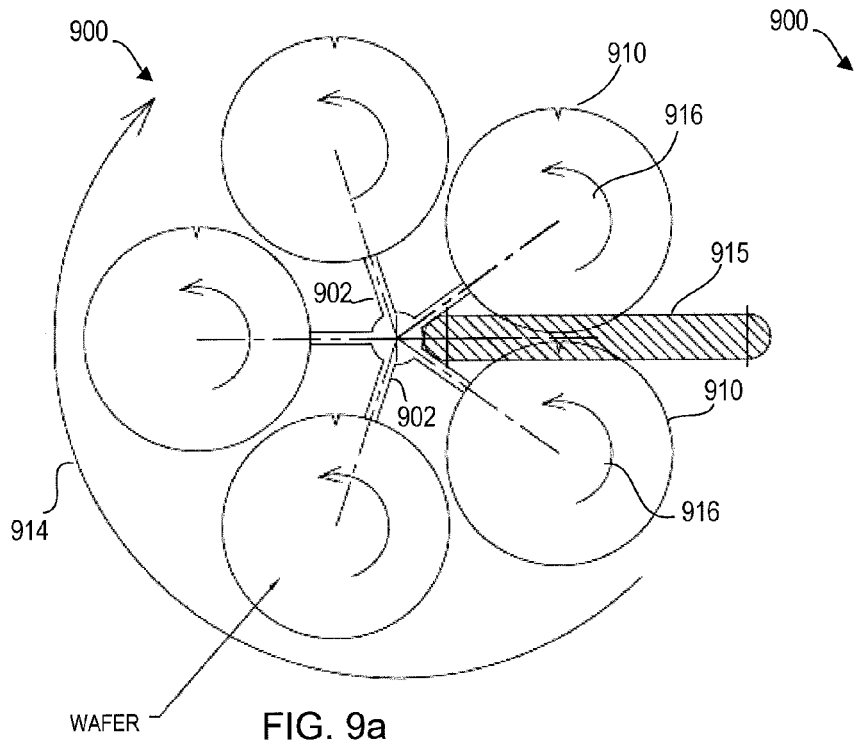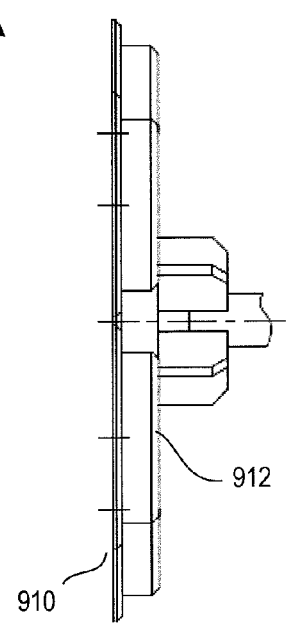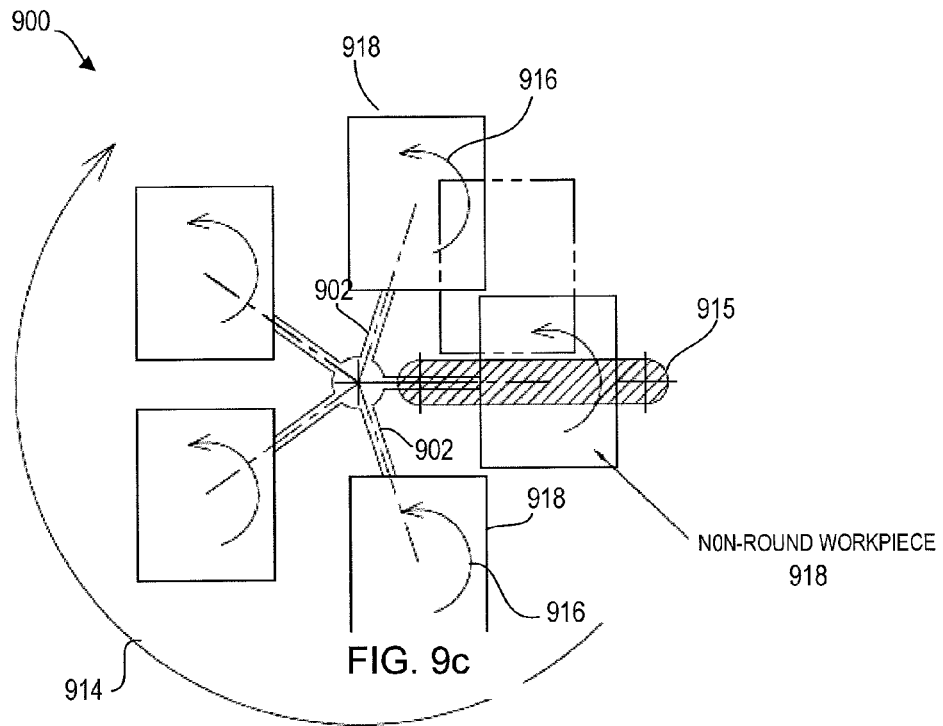
FIG. 9a
FIG. 9b
FIG. 9c

APPARATUS AND METHOD FOR MULTI-DIRECTIONALLY SCANNING A BEAM OF CHARGED PARTICLES

RELATED APPLICATIONS

This application is a Divisional of International Application No. PCT/US09/54095 filed Aug. 17, 2009, which claims priority to provisional application Ser. No. 61/089,362 filed Aug. 15, 2008, and provisional application Ser. No. 61/089,378 filed Aug. 15, 2008. All of the above-referenced applications are incorporated herein by reference.

BACKGROUND

The manufacture of semiconductors typically includes a number of ion implant steps whereby a workpiece, usually a silicon wafer, is presented to an impinging ion beam. The velocity of the ions is set such that they will bury into the workpiece and come to rest at a desired depth, forming an implanted region or layer. The ion beam in almost all cases is smaller than the silicon wafer and measures must be taken to implant the entire wafer surface. The ion dose must be uniformly distributed over the wafer surface and preferably every ion will impinge the wafer surface at the same angle.

In a typical ion implanter, a relatively small cross-section beam of dopant ions is scanned relative to a silicon wafer, which can be done in essentially one of three ways: scanning of the beam in two directions relative to a stationary wafer; scanning of the wafer in two directions relative to a stationary beam; or a hybrid technique where the beam is scanned in one direction while the wafer is mechanically scanned in a second, typically orthogonal, direction. In all cases, the ability to impinge the wafer at selectable non-zero angles of incidence with minimum angle spread is required.

Each technique has advantages and disadvantages. A widely used approach has been to mount a batch of wafers on a disc or at the end of spokes on a rotating wheel which causes a fixed direction ion beam to impinge upon each wafer in turn. The rotating disc or wheel is then scanned to and fro and causes the fixed direction ion beam to impinge upon every part of the surface of every wafer. This technique has proven successful with smaller wafer sizes but is less attractive with today's larger wafers.

For implantation into larger (300 mm) wafers, batch processing is currently not preferred because the individual work-in-process value of each wafer introduces a significant financial risk, should a problem arise during implantation which causes a batch to be scrapped. Another reason batch processing is not preferable is because production flow is simplified for non-batch processing, especially for wafer lot sizes which do not match the batch number for a particular wheel. Still another reason is that single wafer implanters avoid implant angle errors that are inherent in wheel type batch implanters built to-date. Two-dimensional electrostatic or magnetic scanning of an ion beam in orthogonal directions relative to a stationary wafer is a process that has been implemented in early-generation commercial implanters, but modern implanters require all the ions to be traveling in as closely as possible parallel paths, which is increasingly difficult as wafer sizes grow (especially for two-dimensional scanning). Present single-wafer scanning techniques tend to employ so-called hybrid scanning, where the ion beam is scanned or formed into a stationary ribbon by electrostatic or magnetic means in a first direction that is perpendicular to the beam line axis in the ion implanter, and the wafer is mechanically moved in a second, generally orthogonal, direction. In each case, the apparatus to either scan and restore the beam to a parallel condition or mechanically scan the wafer have problematically grown very massive, expensive, and complex as wafer sizes have increased to the present 300 mm wafer size, and this problem will increase as wafer sizes increase in the future.

There are significant advantages (in terms of cost, footprint-minimization of the length of the beam line, weight, and lower mechanical complexity) if a much simpler, more compact and lower cost scanning system is employed. These advantages can be used to produce cost effective, application specific, implanter tools, which can be optimized for one or just a few implant process steps. In this way, the ever increasing complexity and performance compromises of broad range implanters is avoided. For example, one implanter may be optimized for light ions at moderate energies such as is required for high-dose hydrogen implanting for layer separation and another implanter may be optimized for low energy high-dose boron such as is used in source/drain or source/drain extension implants. Other examples could optimize performance for higher energy low-dose or cluster ion beams such as decaborane or GCIB (Gas Cluster Ion Beam).

U.S. Pat. No. 4,295,048 discloses a system of deflecting electrons to a plurality of discrete positions using a series of sequentially operated magnets arranged along a beam pipe. The electron beam is deflected by each magnet in turn to an electron window associated with each magnet. U.S. Pat. No. 6,617,586 also discloses a system for deflecting an electron beam, in this case a pulsed electron beam, to a plurality of discrete positions using a series of sequentially operated magnets. However, both of these systems are only suitable for deflecting electrons to discrete positions, and do not allow for continuous scanning of a charged particle beam to produce a uniform dosage across a target wafer. Furthermore, both systems are only described in relation to electron beams, and in the case of U.S. Pat. No. 6,617,586, specifically to pulsed electron beams.

It is therefore an object of the present invention to provide scanning of the beam of charged particles across a target surface in a continuous manner, to provide for uniform dosage of particles across the surface, or at least to provide the public with a useful choice.

SUMMARY OF THE INVENTION

The following embodiments provide a variety of novel beam management (i.e., generation, scanning, focusing) methods and devices that can be optionally employed to tailor a simple low cost small footprint ion implanter architecture (FIG. 1a) to particular ion species, beam current, energy, and throughput performance ranges, while preserving the basic implanter architecture and a large number of common parts. While a primary goal of beam management technology, the following embodiments are not limited to only the illustrated architecture, and may have other applications, some of which are described.

Non semi-conductor doping ion implant applications, such as layer separation, materials modification, and photovoltaic devices, may be suited to the methods and systems described herein, which are particularly adaptable to large work pieces, but which may also be adaptable to other materials.

In an embodiment, a system for scanning a beam of charged particles across a target surface includes a beam source for producing a beam of charged particles along an incident beam axis; a beam deflector, positioned on the incident beam axis, for deflecting the beam of charged particles away from the incident beam axis towards the target surface;

and a rotation mechanism coupled to the beam deflector to rotate the beam deflector about the incident beam axis.

In an embodiment, a method for scanning a beam of charged particles across a target surface includes the steps of: providing a beam of charged particles along an incident beam axis; providing a beam deflector on the incident beam axis, for deflecting the beam of charged particles away from the incident beam axis towards the target surface; and rotating the beam deflector about the incident beam axis to scan the beam across the target surface.

In an embodiment, an ion implant apparatus includes an ion source for producing an ion beam along an incident beam axis; a beam deflecting assembly for receiving and deflecting the ion beam; a rotation mechanism coupled to the beam deflecting assembly for rotating the beam deflecting assembly about the incident beam axis; a first wafer holder for holding target wafers; and a second wafer for holding target wafers. The rotation mechanism is operable to direct the ion beam at the first wafer holder and the second wafer holder.

In an embodiment, a system for scanning a beam of charged particles across a target surface includes a beam source for producing a beam of charged particles; and a beam deflector. The beam deflector includes a series of individually controllable deflecting elements arranged along a beam path, and a control means coupled to each of the deflecting elements. The control means is operable to control the deflecting elements to provide for a substantially continuous sweep of the beam of charged particles across the target surface.

In an embodiment, a method of scanning a beam of charged particles across a target surface using a series of individually controllable deflecting elements arranged along an incident beam axis includes controlling each of the deflecting elements to provide a traveling magnetic or electric field. The traveling field moves along the axis of the incident beam to provide a substantially continuous scan of the incident beam.

In an embodiment, a charged particle beam scanning apparatus includes a beam scanner for scanning a beam of charged particles in a first direction, and a beam focusing assembly positioned to receive the beam of charged particles from the beam scanner. The beam focusing assembly has a series of individually controllable deflecting elements arranged along the first direction. The beam focusing assembly focuses the beam in the first direction.

In an embodiment, a method of focusing a beam of charged particles scanning in a first direction includes the steps of: providing a series of individually controllable beam deflecting elements arranged along a first direction; and controlling each of the deflecting elements to focus the beam as it scans across the series of deflecting elements.

In an embodiment, an apparatus for multi-directionally scanning a beam of charged particles across a target surface includes a beam source for producing a beam of charged particles, a beam scanner for scanning the beam of charged particles in a first direction; a beam deflector for deflecting the beam of charged particles; and a linear actuator coupled to the beam deflector for moving the beam deflector in a second direction to provide beam scanning in the second direction.

In an embodiment, a multi-directional charged particle beam scanning apparatus has a beam source for producing a beam of charged particles along an incident beam axis. A beam deflector deflects the beam of charged particles. A linear actuator coupled to the beam deflector moves the beam deflector along the incident beam axis, and a rotation drive mechanism coupled to the beam deflector rotates the beam deflector about the incident beam axis.

In an embodiment, an apparatus for multi-directional scanning of a charged particle beam includes a beam source for producing a beam of charged particles along an incident beam axis. A beam scanner scans the beam of charged particles in a first direction. A beam deflector receives the beam of charged particles from the beam scanner. Electrodes disposed with the beam deflector extend in the first direction, to receive the beam throughout scanning and to deflect the beam of charged particles. A linear actuator coupled with the beam deflector moves the beam deflector to scan the beam in a second direction.

In an embodiment, a method for bi-directionally scanning a beam of charged particles includes: scanning a beam of charged particles in a first direction; and moving a beam deflector in a second direction, non-parallel with the first direction, to scan the beam in the second direction.

BRIEF DESCRIPTION OF THE DRAWINGS

FIG. 1b is a cross-section of the embodiment shown in FIG. 1a.

FIG. 2b is a cross-section of the embodiment shown in FIG. 2a.

FIG. 4b is an end view of the deflector assembly shown in FIG. 4a.

FIG. 5b is a cross-section of the embodiment shown in FIG. 5a.

FIG. 7a is a plan view of a dual-chuck layout for mounting wafers for scanning, according to an embodiment.

FIG. 7b is a second angle projection of the dual-chuck layout of FIG. 7a.

FIG. 7c is a third angle projection of the dual-chuck layout of FIG. 7a.

FIG. 8a is a schematic representation of an ion implanter including the dual-chuck layout of FIGS. 7a-7c, according to an embodiment.

FIG. 8b is a cross-sectional view of the implanter of FIG. 8a.

FIG. 9a shows a ring arrangement for supporting and transferring a batch of wafers, according to an embodiment.

FIG. 9b is a side view of the ring arrangement of FIG. 9a.

FIG. 9c shows the arrangement of FIG. 9a, mounted with non-circular workpieces in lieu of wafers.

FIG. 10 is a schematic view of an implanter architecture having a cluster of the implanter systems of FIGS. 8a.

FIG. 12b is an end cross-section of the deflector assembly shown in FIG. 12a.

FIG. 12c is a side cross-section of one side of the deflector assembly shown in FIG. 12a.

FIG. 14b is a cross-section of the implanter architecture shown in FIG. 14a.

FIG. 16b shows a cross-section of the assembly shown in FIG. 16a.

FIG. 17b is an end view of the arrangement of FIG. 17a.

DETAILED DESCRIPTION

Figure 1A:
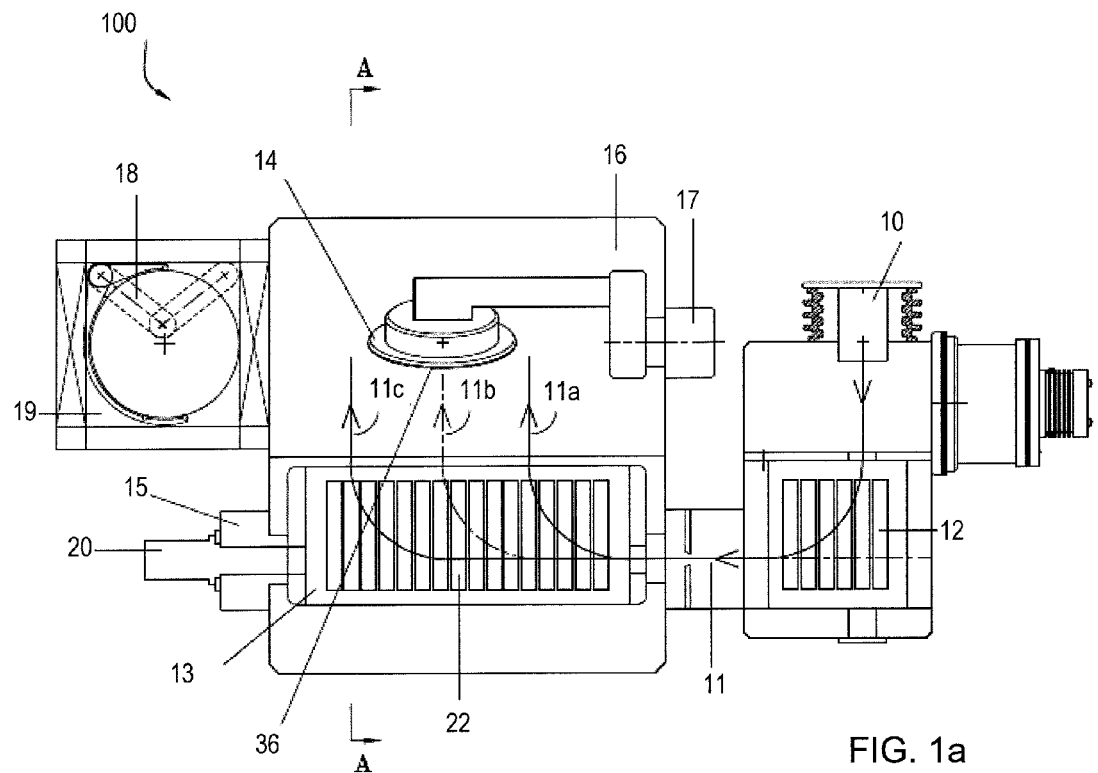
FIG. 1a is a schematic representation according to a first embodiment.

FIG. 1a shows an exemplary architecture of an ion beam implanter system 100 for implanting target wafers with ions. Implanter system 100 (hereinafter also referred to as "implanter 100") includes an ion beam source 10 and an analyzer magnet 12. Analyzer magnet 12 is shown as formed from a series of discrete magnetic elements, but it may be of a conventional type. An ion beam 11, shown as a line, formed by ion beam source 10 passes through analyzer magnet 12 and, after passing through a resolving aperture, enters a beam deflector assembly 13. Ion beam 11 may represent any type of charged particle beam. Deflector assembly 13 is, for example, a magnetic assembly formed from a series of individually controllable deflector elements. In an embodiment, at least one of the deflector elements is an electromagnet. Alternately, each individually controllable deflector element is an electromagnet. In another embodiment, at least one of the deflecting elements is an electrode plate.

Deflector assembly 13, for example, includes two rows of opposing coils 23 wound around a series of poles 22. Rows of coils 23 can be seen in the view of FIG. 1b. Coils 23 are arranged in a row that extends in the direction of incoming ion beam 11. The deflector elements can be controlled to provide, in effect, a traveling magnetic field that is used to deflect the ion beam to scan it over a target surface.

Deflector assembly 13 is aligned with the axis of incident ion beam 11. The yoke on which the deflector assembly is mounted is rotatable about the axis of incident ion beam 11 using a rotational drive mechanism 15. Rotational drive mechanism 15, for example, rotates deflector assembly 13 to direct beam 11 towards, and scan beam 11 across, a target surface such as a surface of a wafer. Rotational drive mechanism 15 may be a suitable drive mechanism, such as a servo motor.

Implanter 100 includes a wafer chuck 14 for holding and tilting a target wafer 36. Wafer chuck 14 is mounted within a processing vacuum chamber 16. Chuck 14 is tilted under the control of a tilting drive 17. Tilting drive 17, for example, controls tilt of the wafer depending upon a rotational position of deflector assembly 13, such that beam 11 is incident on the target surface (e.g., a wafer 36 surface). A control means (which may be a servo system linking drive elements 15 and 17 or mechanical linkage) is used to coordinate the tilt angles of wafer chuck 14 and deflector assembly 13 in order to maintain a precise angle of incidence of ion beam 11 impinging upon wafer 36. This implant angle is illustrated as ninety degrees, but may be preset prior to starting an implant process to any angle, and the preset angle should remain constant during the entire angular beam scan. Alternatively, the implant angle may be varied during an implant process. For simplicity purposes only, circular wafers are described. It will be appreciated by one of ordinary skill, after reading and comprehending the present Application, that workpieces (targets) may be any shape.

Beam deflector assembly 13 provides beam scanning in the direction of incident ion beam 11. FIG. 1a shows ion beam 11 scanned to three different positions, 11a, 11b, and 11c. Scanning in a second direction is provided by the rotation of deflector assembly 13 about the axis of incoming beam 11. The traveling magnetic field may provide a fast scan at about 10-100 Hz, and the mechanical, rotational scan may provide a slow scan at about 0.5 Hz. The angle through which the rotational scan travels depends on the dimensions of the target (e.g., the wafer surface) and the distance between the target and deflector assembly 13. In an embodiment, deflector assembly 13 rotates through +/−25°.

In order to keep the angle between the target surface and ion beam 11 constant across the scan, wafer chuck 14 may be controlled to rock in synch with rotation of deflector assembly 13. This motion is illustrated more clearly in FIG. 1b.

Figure 1B:
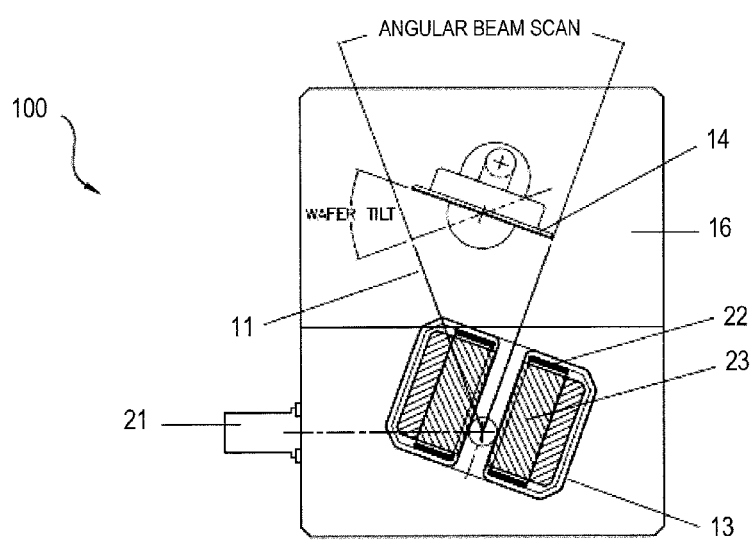

FIG. 1b is a cross-sectional view along the line A-A shown in FIG. 1a. It can be seen that the wafer can be tilted to maintain ion beam 11 at normal incidence throughout the scan. Also shown in FIG. 1b is a beam dump 21, to which ion beam 11 is directed when the wafer is being replaced. Beam dump 21 may extend the full length of deflector assembly 13 and may be used for beam diagnostics. A "straight through" beam measuring position 20 is also provided to measure and set up the beam with the scanner off.

FIG. 1a also shows components for moving wafers to and from wafer chuck 14. Wafers are loaded into a load lock 19, for example, through a slit valve. A wafer transfer assembly 18 moves the wafer to chuck 14. When ion implantation of the wafer is complete, wafer transfer assembly 18 moves the wafer back to load lock 19 and the wafer is removed via the slit valve.

Figure 2A:
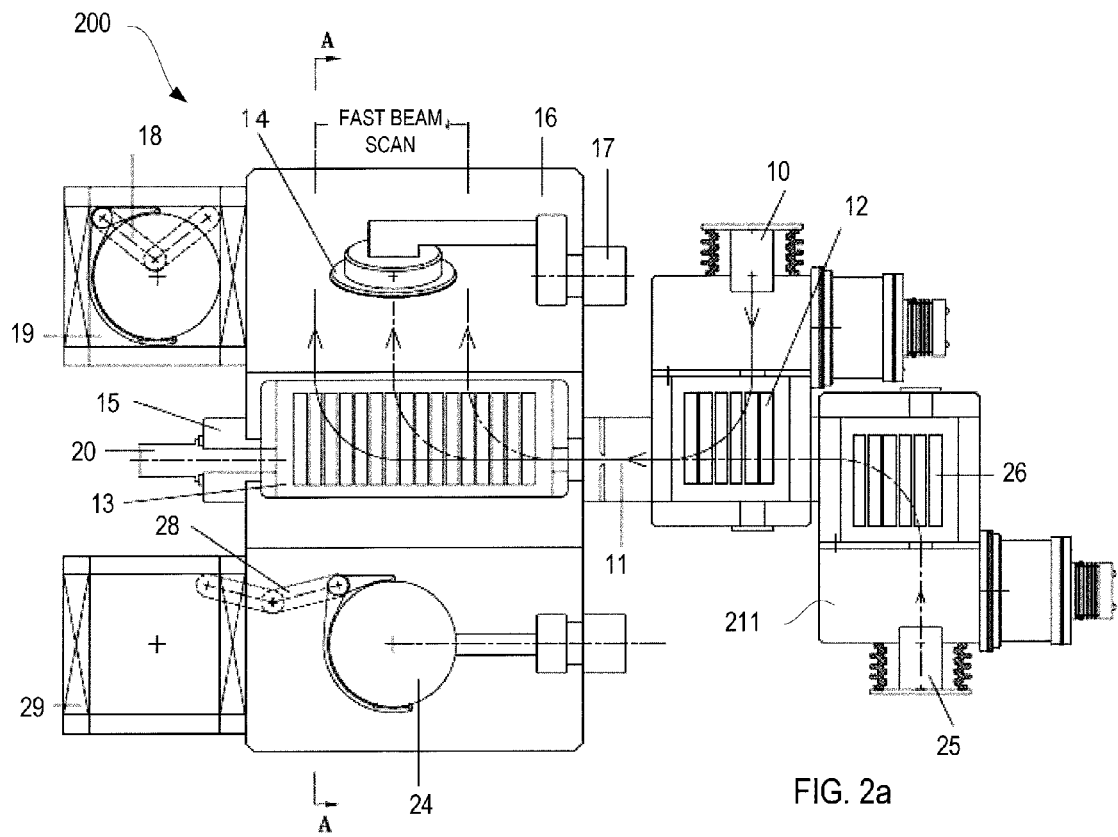
FIG. 2a is a schematic representation according to an embodiment.
Figure 2B:
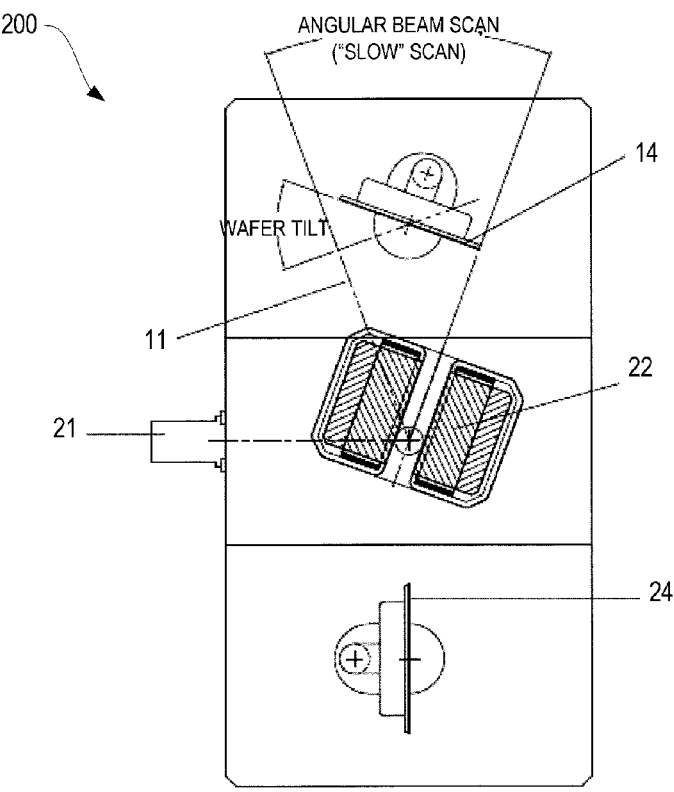

FIGS. 2a and 2b illustrate an alternative architecture ion beam implanter 200. FIG. 2a is a plan view of implanter 200 and FIG. 2b is a cross-sectional view along the line A-A of FIG. 2a. Implanter 200 includes features of implanter 100; accordingly, these features are numbered as in FIGS. 1a and 1b. Implanter 200 additionally includes a second ion beam source 25 and a corresponding second analyzer magnet 26. Second ion beam source 25 produces a second incident ion beam 211, which enters second analyzer magnet 26. Second analyzer magnet 26 is aligned with deflector assembly 13 so that upon exiting second analyzer magnet 26, second ion beam 211 enters deflector assembly 13 along its axis of rotation, in the same manner as ion beam 11 from ion beam source 10. It is often desired to implant different ion species into a single wafer. Using implanter 200, it is possible to switch quickly between ion beam sources 10 and 25 by switching respective analyzer magnets 12 and 26 on and off. Ion beam sources 10 and 25 may be kept hot, that is, ready for immediate use. While only two ion sources are shown in FIG. 2a, it will be appreciated by one of ordinary skill, upon reading and comprehending the present Application, that any number of ion sources may be incorporated in the architecture of implanter 200.

Implanter 200 also includes a second target position on the opposite side of deflector assembly 13 to the first target position (e.g., at chuck 14). At the second target position, there is a tilting wafer chuck 24 for holding a second wafer, a tilting drive 17, and an associated wafer loading and unloading equipment 28, 29, described below. Deflector assembly 13 not only rotates to provide a slow scan across each wafer, it may also rotate through 180° to implant the second target (i.e., a second wafer) once the first target implant is complete. In other words, rotational drive mechanism 15 may rotate deflector assembly 13 to direct beam 11 towards, and scan beam 11 across, a wafer held by either chuck 14 or by chuck 24. While the second target is being implanted, the first target (i.e., first wafer) can be unloaded from chuck 14 and replaced with a new target. Any number of target wafer stations can be provided around deflector assembly 13 using this architecture. Ion beam diagnostics may be provided at beam dump 21 between the two targets or at a "straight through" position 20 that ion beam 11 impinges on when deflector assembly 13 is not energized.

In FIG. 2a, second chuck 24 is shown rotated approximately 90° from the implant position, for unloading of a wafer secured at chuck 24 through a load lock assembly 29. Load lock assemblies 19, 29 are shown arranged parallel to one another; however, they may be in a desired configuration, to interface with a wafer handling assembly or cluster tool.

A number of different deflector assemblies may be used with the above described implanters. A deflector assembly may provide scanning of beam 11 and/or 211 in a direction substantially parallel to the incoming (or incident) beam axis, as described above. Alternatively, a deflector assembly may provide no further scanning beyond a rotational scan about the incoming beam 11/211 axis. In such a case, the target wafer may be moved to provide scanning over the entire wafer surface. In addition, the wafers may be scanned in two dimensions and the rotation of the deflector assembly may be used only to move the ion beam (e.g., beam 11 or 211) from one target position to another.

As discussed above, the deflector assembly (e.g., beam deflector assembly 13) may provide beam scanning via a series of individually controllable deflecting elements (e.g., opposing coils 23 with corresponding sets of poles 22) arranged along a beam path that includes the deflector. Beam deflector assembly 13 illustrates sixteen such electromagnets. In the condition when all electromagnets are equally energized, ion beam 11 will be subject to a generally uniform magnetic field and will bend according to beam position 11a. If the first ten electromagnets are turned off, but all others remain on, beam 11 will travel further into the magnet array of assembly 13 before becoming subject to the magnetic field, and will bend according to position 11b. A controller such as a computer coupled to each of the deflecting elements may coordinate the adjustment of the deflecting elements to provide for a substantially continuous sweep of the beam of charged particles (e.g., beam 11) across the target surface.

Alternately or additionally, beam scanning means may be provided by a linear actuator that moves the deflector assembly along the incident beam axis (i.e., a linear actuator that moves beam deflector assembly 13 along the axis of beam 11). Deflector assembly 13 may be electrostatic, for example, including an electrostatic minor or a pair of curved electrode plates, or deflector assembly 13 may be magnetic.

Figure 3:
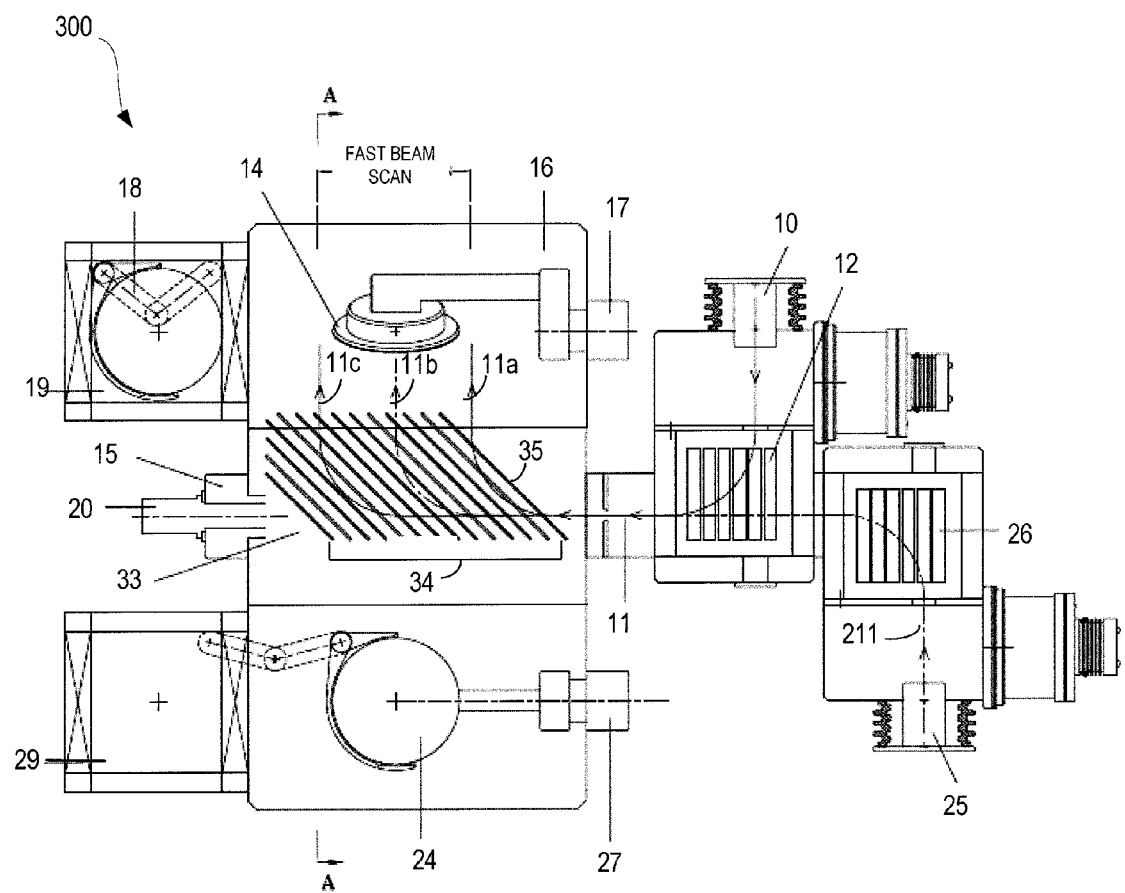
FIG. 3 is a schematic representation according to an embodiment.

FIG. 3 shows an ion beam implanter 300. Implanter 300 includes features of implanters 100 and 200. For simplicity, shared features are indicated using the same reference numbers. Implanter 300 has an electrostatic deflector assembly 33, formed from two parallel arrays 34 of electrode plates 35 (only one array 34 is visible in FIG. 3, however, the second array is positioned above the array shown with a gap between the arrays to allow the beam to travel between them. Since the pairs of plates 35 positioned above and below the beam are at the same electric potential, an equipotential is formed across the beam gap provided the gap is small. For larger gaps, a grid is typically used to bridge the gap and create the equipotential, while still allowing the beam through. A charged particle beam, such as ion beam 11, travels between arrays 34. Corresponding plates 35 of each array 34 are held at the same electric potential, but successive sets of plates 35 are sequentially energized to different potentials resulting in a field gradient that causes the beam particles to deflect. Plates 35 effectively act as a traveling electrostatic mirror and deflect the charged particles (e.g., of ion beam 11) as a result of an electric field generated between successive adjacent plates 35 in each array 34.

As shown in FIG. 3, plates 35 are angled at 45° relative to incident ion beam 11. However, it will be appreciated by one of ordinary skill, after reading and comprehending the present Application, that other plate-beam angles may be chosen in order to selectively deflect ion beam 11 (i.e., through different angles).

By controlling the voltage applied to each plate 35, deflected ion beam 11 scans in the same manner as described and shown with respect to deflector assembly 13 of FIGS. 1a, 1b, 2a, and 2b. Ion beam 11 is shown in three positions 11a-11c in FIG. 3. A smooth scan may be achieved by using a suitable control strategy, i.e., energizing a plurality of adjacent plates 35 within each array 34 at any one time. Electrostatic deflector assembly 33 may be mounted with a yoke and rotated or translated in the same manner as beam deflector assembly 13 of FIGS. 1a, 1b, 2a, and 2b.

Figure 4A:
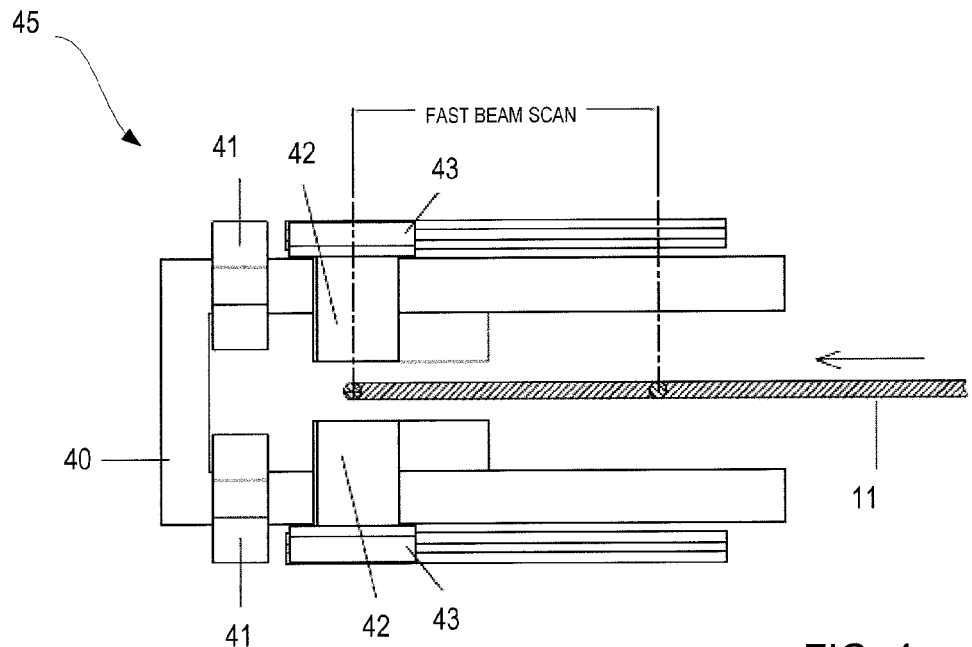
FIG. 4a is a schematic representation of a deflector assembly for use according to an embodiment.
Figure 4B:
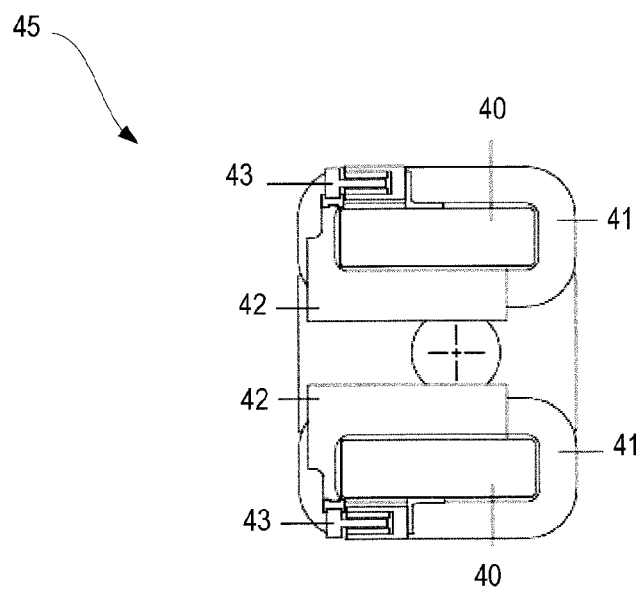

FIGS. 4a and 4b show one deflector assembly 45 for use in implanters 100, 200, or 300, in accordance with an embodiment. FIG. 4a is a side view of deflector assembly 45. FIG. 4b is an end view of deflector assembly 45.

Deflector assembly 45 includes a C-shaped yoke 40 around which one or more coils 41 are wound to provide a magnetic field. Yoke 40 is formed from a material with a high magnetic permeability, for example, from a material used to form a magnetic core. Traveling magnetic pole pieces 42 slide along yoke 40 and provide an area of reduced clearance between opposing faces of yoke 40. Pole pieces 42 have a higher magnetic permeability than air and vacuum. Thus, the magnetic field generated by coils 41 is concentrated in yoke 40, pole pieces 42, and in the space between the pole pieces (see FIGS. 4a and 4b). The magnetic field between pole pieces 42 is, for example, used to bend ion (or electron) beam 11. By moving pole pieces 42 along yoke 40, ion beam 11 can be made to scan. In practice, measures would be taken to minimize the influence on the beam of stray magnetic field between the yoke arms by minimizing the stay field magnitude and employing magnetic shielding to protect the beam. Pole pieces 42 may be mounted with yoke 40 using air bearings or other mountings that counter the magnetic attraction between yoke 40 and pole pieces 42. Various arrangements (not shown) may be used to maintain ion beam 11 in a vacuum. Pole pieces 42 are shown attached to linear motors 43, which are mounted on yoke 40, and which drive pole pieces 42 to achieve a desired scan.

Deflector assembly 45 may be coupled to a rotation mechanism and incorporated into an implanter architecture, such as implanters 100, 200, and 300, described above. Alternately, other deflector assemblies may be incorporated into implanters 100-300. For example, an electrostatic beam deflector with a single pair of arcuate or spherical (spherical plate inflector), nested electrode plates may be mounted with a linear actuating mechanism, such as a linear motor, moving along the axis of the incident ion beam (i.e., beam 11) to provide for a beam scan.

Figure 5A:
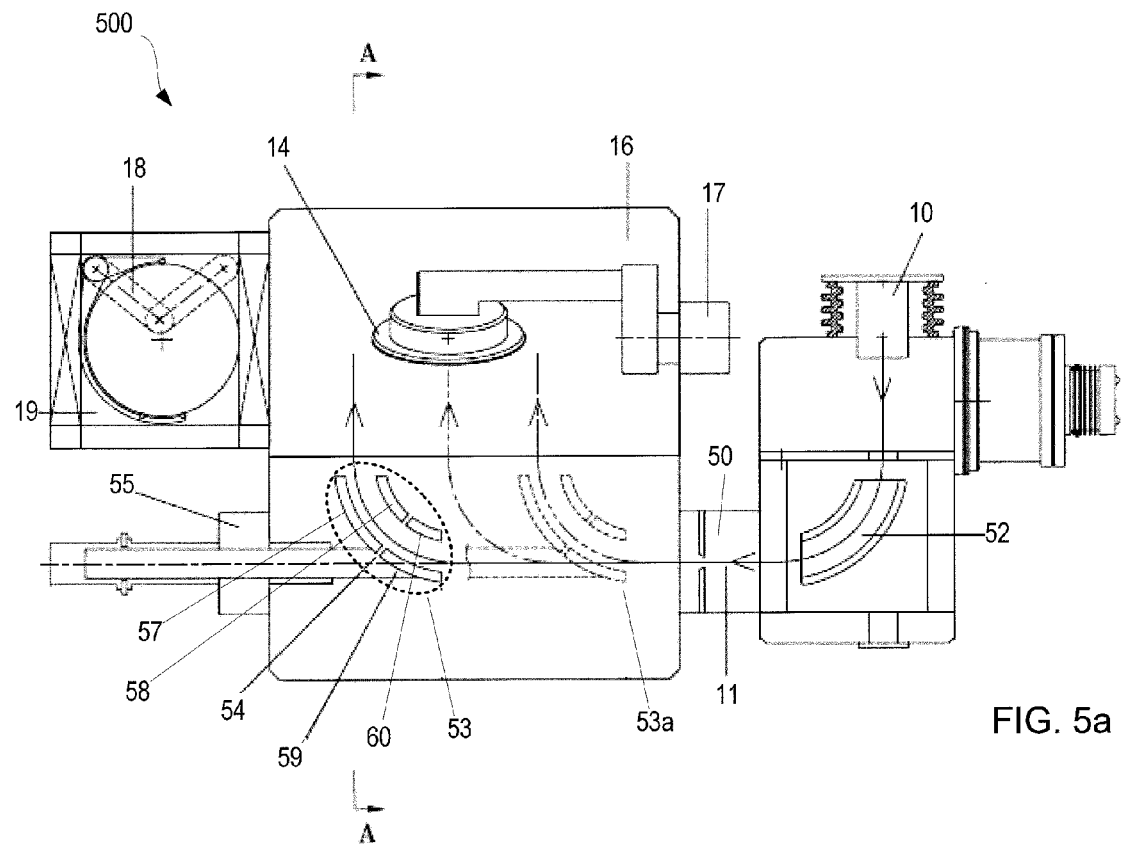
FIG. 5a is a schematic representation according to an embodiment.
Figure 5B:
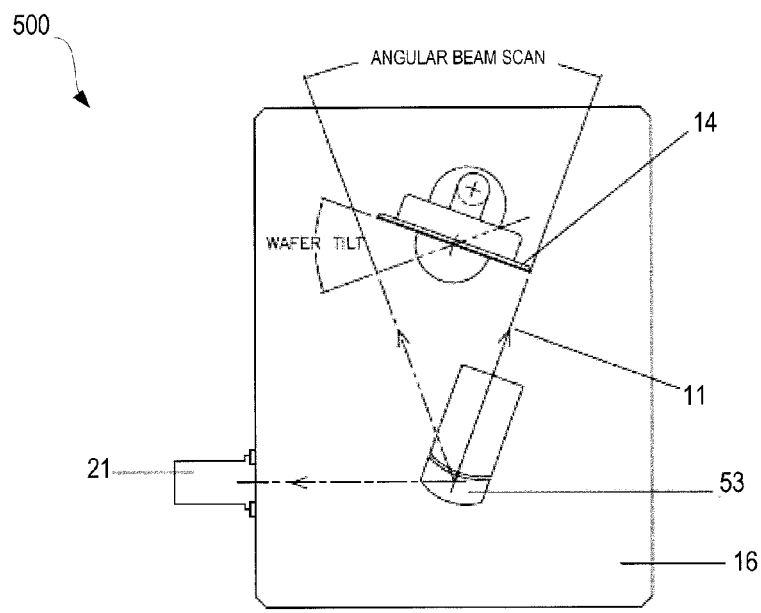

Such an arrangement is schematically illustrated in FIGS. 5a and 5b. FIG. 5a is a schematic representation of an implanter 500, and FIG. 5b is a cross-sectional view of implanter 500. The basic architecture is similar to that shown in FIGS. 1-3, and some of the features shared between implanters 100-300 and 500 are indicated using same reference numbers.

Implanter 500 includes ion beam source 10 and an analyzer magnet 52. Analyzer magnet 52 is, for example, of a conventional type. Ion beam 11 passes through analyzer magnet 52 and, after passing through a resolving aperture 50, enters a beam deflector assembly 53. Typically, an "electrostatic mirror" (not described here) or a "spherical plate inflector" would be of a conventional type known in the art. The beam deflector assembly 53 is, for example, an electrostatic deflector including a spherical plate inflector separated into two sections in order to create a deceleration/acceleration gap 54 part way around the inflector curvature. The ion beam 11 is deflected part of the total angle by the action of the electrodes 59 and 60 and deflected the balance by the action of electrodes 57 and 58. In between these two deflection stages the beam energy is decreased (or increased) by an electric field gradient formed in the gap 54. In practice, one or more electron suppression electrodes would most likely be located in the deceleration/acceleration gap. For clarity of illustration, suppression electrodes are not shown in FIGS. 5a and 5b.

The deflector assembly 53, as shown in the partial-section illustration FIG. 5a, appears to be arc segments but in practice are nested sections from the surface of spheres of a predetermined radius. Curvature of the arc segments in the direction orthogonal to the deflection plane is illustrated in FIG. 5b. Alternatively, an array of plates or mesh forming a similar spherical geometry may be used to facilitate vacuum pumping in gap 54 and minimize beam-strike for neutral or off-energy charged particles. An electric potential is set up between the inner and outer spherical sections to provide an electric field transverse to the ion beam direction, which deflects ion beam 11 through 90°. Other deflection angles can be achieved by this technique. The electric field magnitude required varies depending upon the ion beam energy and can be easily calculated.

In order to scan ion beam 11 across the target wafer, deflector assembly 53 undergoes both linear and rotational movement. The linear movement translates the deflector assembly 53 along the axis of the incoming beam and is so illustrated in FIG. 5a by depicting the deflector assembly 53 in a second location as deflector assembly 53a to represent the extents of the linear translation. Deflector assembly 53 is, for example, mounted with a linear and rotational drive mechanism 55. As shown in FIG. 5a, deflector assembly 53 deflects ion beam 11 through 90° and moves along the axis of incoming ion beam 11 to scan beam 11 across the target wafer parallel to the axis of incoming beam 11. Deflector assembly 53 rotates about the incoming beam 11 axis to scan beam 11 across the wafer in a direction perpendicular to the incoming beam 11 axis. It is likewise possible to use deflector assembly 53 to deflect ion beam 11 through a different angle, and to provide the target wafer at a different inclination to deflected ion beam 11.

Alternatively, deflector assembly 53 may be a single electrostatic or magnetic deflector that is stationary, apart from rotation about the axis of incoming beam 11. In this case, the target wafers can be moved to provide scanning over the entire wafer surface. Additional elements may be included in implanters 100-300 and 500 to provide for beam focusing and filtering.

Rotation of deflector assemblies may provide any of implanters 100-300 and 500 with a compact, flexible, and scalable architecture that can incorporate two or more target wafer positions to provide for high throughput. Particular deflector assemblies may be chosen to suit particular applications. For example, when high beam current/low beam energy implant is required, a magnetic deflector assembly might be used. When low beam current/high beam energy is required, an electrostatic deflector assembly might be more suitable. The architecture described herein allows for the simple addition of further ion sources, and may also be modified or provided as a retrofit assembly to interface with existing wafer handling equipment.

While the concepts described generally refer to various forms of linear beam scanning combined with rotational beam scanning, which is coupled with synchronized wafer tilting to maintain a fixed implant angle, it should be noted that the linear scan effectively forms a ribbon beam which is swept over the wafer by the rotational scan. Ribbon beams created by other means could also be used to achieve similar benefits in implant tool simplicity and cost. The linearly scanned beam may alternatively remain fixed and the wafer can be translated through the ribbon so as to expose the entire wafer. Also, the linear scan may be eliminated in the case where the wafer is rotated so that the beam effectively implants an annulus on the wafer surface and the rotational beam scan would then cause the annular exposure to change in radius until the entire wafer is exposed.

While the workpiece is described in this document as a wafer for semiconductor manufacture, other targets may be implanted by adapting the holder and workpiece handling to suit desired applications.

Figure 6:
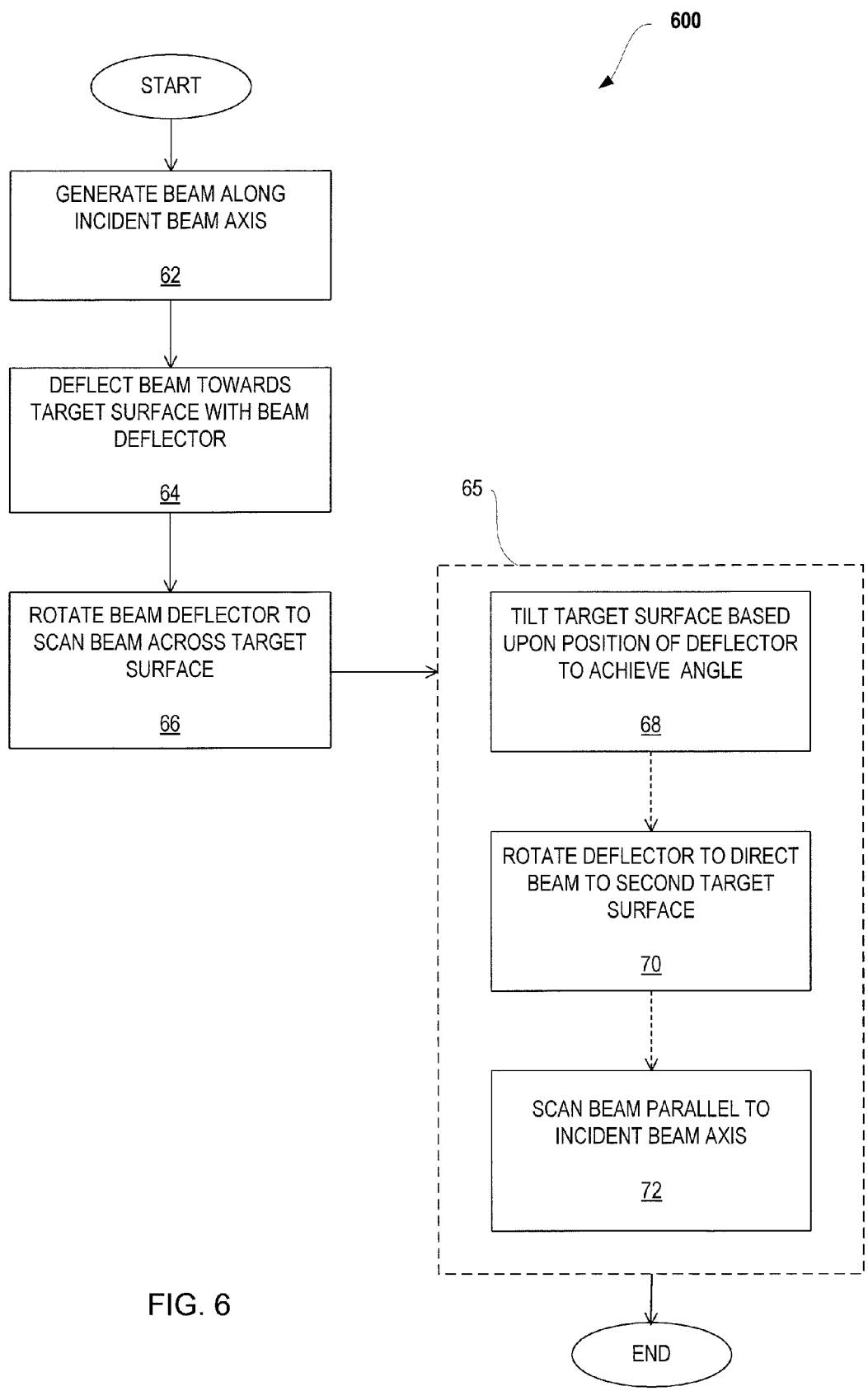
FIG. 6 is a flow chart depicting a method for scanning a beam of charged particles across a target surface, according to an embodiment.

FIG. 6 is a flow chart depicting a method 600 for scanning a beam of charged particles across a target surface. A beam of charged particles is generated along an incident beam axis, in step 62. The beam of charged particles is deflected away from the incident beam axis and towards a target surface, in step 64. In one example of steps 62 and 64, ion beam 11 is provided by ion beam source 10 along an incident beam axis that intersects deflector assembly 13. Deflector assembly 13 is adjusted, e.g., via rotational drive mechanism 15, to deflect beam 11 toward wafer chuck 14 holding a target wafer.

The beam is scanned across the target surface in step 66. For example, rotational drive mechanism 15 rotates deflector assembly 13 to scan beam 11 across the wafer surface (see, e.g., FIGS. 1a-3). Step 66 may be followed by one or more of optional steps 68-72 (indicated by dotted box 65). In step 68, the target surface, e.g., the wafer, is tilted based upon a rotational position of the beam deflector to achieve a predetermined angle between the beam and the target surface. In one example of step 68, tilting drive 17 tilts wafer chuck 14 depending upon position of deflector assembly 13, so that beam 11 strikes the target wafer at a predetermined angle throughout a scan. A feedback loop (not shown in FIGS. 1a-6, for ease of illustration) between deflector assembly 13 and/or rotational drive mechanism 15 and tilting drive 17 may be employed for automatically tilting wafer chuck 14 (and a secured wafer) to achieve and maintain the desired angle throughout a scan.

In optional step 70, the deflector is rotated to direct the ion beam to a second target surface. In one example of step 70, rotational drive mechanism 15 rotates deflector assembly 13 to direct incident ion beam 11 towards second wafer chuck 24, to which a second wafer is secured. As described with respect to step 68, above, tilt of wafer chuck 24 may be adjusted to achieve and maintain a desired wafer-to-beam angle throughout a scan. For example, wafer tilt drive 27 may communicate with rotational drive mechanism 15 and, based upon a position of deflector assembly 13, tilting wafer chuck 24 to achieve a predetermined wafer-to-beam angle.

In optional step 72, the beam is scanned in a direction substantially parallel to the incident beam axis. In one example of step 72, deflector assembly 53 (FIGS. 5a and 5b) deflects ion beam 11 through 90° and moves along the axis of incoming ion beam 11 to scan beam 11 across the target wafer parallel to the axis of incoming beam 11.

FIGS. 7a-7c illustrate alternate views of a dual-chuck system 700, for holding and transferring two wafers 710 (or other workpieces) through an angular scan. System 700 includes two wafer chucks 712. For example, as shown in FIGS. 7b-7c, wafer 710a is mounted with chuck 712a, and wafer 710b mounts with chuck 712b. In one embodiment, chucks 712a, 712b are e-chucks, which electrostatically clamp a wafer or other workpiece, to hold it without mechanical clamps. Chucks 712a, 712b mount with arms 714a, 714b, respectively, which then connect with a turntable 716. Turntable 716 rotates one chuck 712 into a horizontal wafer load position while the other chuck 712 is exposed to a scanning beam. For example, FIG. 7b shows chuck 712a positioned for exposure to a beam 718 for linear scanning, while chuck 712b (not shown beneath wafer 710b) is in a horizontal wafer load position. FIG. 7c is a third angle projection of 7b showing chuck 712b in the horizontal wafer load position, while wafer 710a is scanned by beam 718 in an angular scan.

System 700 achieves scanning and loading with very little dead-time between wafers. A finished wafer (e.g., 710b, FIGS. 7b and 7c) is unloaded and a fresh wafer loaded onto a chuck which is stationary in a horizontal orientation, while the other chuck (e.g., chuck 712a) is exposed to the beam. The angular scan during implant can be quite slow, for example, in the range of 0.5 to maybe 3 Hz, so a fairly simple mechanism will hold the stationary wafer still for load/unload.

The throughput of an implanter is strongly affected by implant dead-time which occurs any time during which the beam is not impinging upon the wafer. Provided the wafer exchange can be completed in a time less than or equal to the implant time, which would be typically the case for high dose implants, wafer exchange will occur almost entirely in the background, resulting in maximum beam utilization. With system 700, the dead-time to exchange chucks may be very short, resulting in only a second or two between the finish of one implant and the start of the next. For very low implant doses where the implant time can be as short as a few seconds, the exchange time is commonly longer than the implant time for most implanters on the market today.

FIGS. 8a and 8b show an ion beam implanter system 800 for implanting a target (e.g., a wafer) with ions. Implanter system 800 (hereinafter also referred to as "implanter 800") includes an ion beam source 810 and an analyzer magnet (beam analyzing magnet) 812. Analyzer magnet 812 is shown as a 60° magnet of traditional style, and could also be formed from a series of discrete magnetic elements, as described above. The ion beam 811, indicated by a line, is formed by ion beam source 810 and passes through analyzer magnet 812 and, after passing through a resolving aperture, enters a beam deflector assembly 813, formed as a traveling field beam-scan magnet. Beam deflector assembly 813 is, for example, a magnetic assembly formed from a series of individually controllable elements. In one embodiment, at least one of the elements is an electromagnet. Alternately, each individually controllable element is an electromagnet. In another embodiment, at least one of the elements is an electrode plate.

Beam deflector assembly 813, for example, includes two rows of opposing coils 823 wound around a series of poles 822 (see FIG. 8b). Poles 822 are arranged in a row that extends in the direction of incoming ion beam 811. The individually controllable elements can be controlled to provide, in effect, a traveling magnetic field that is used to deflect ion beam 811 to scan it over a target surface (such as a wafer 710, described with respect to FIGS. 7a-7c).

Beam deflector assembly 813 is aligned with the axis of incident ion beam 811. The yoke on which the deflector assembly is mounted is rotatable about the axis of incident ion beam 811 using a rotation drive mechanism 815. Rotation drive mechanism 815 for example rotates beam deflector assembly 813 to direct ion beam 811 towards, and scan ion beam 811 across, a target surface such as a surface of wafer 710. Rotation drive mechanism 815 may be a suitable drive mechanism, such as a servo motor. A straight-through beam measuring cup 820 measures beam strength and/or angle.

Implanter 800 includes dual-chuck system 700, for positioning a target wafer secured with a chuck (e.g., wafer 710a mounted with chuck 712a) for ion implantation, while a second chuck (e.g., chuck 712b, obscured by wafer 710b) is positioned for wafer loading/unloading. In an embodiment, a loadlock or cluster wafer delivery tool 814 transfers wafers 701 to and from chucks 712. Wafers are loaded into loadlock/delivery tool 814, for example, through a slit valve (not shown). A wafer transfer assembly 819 moves wafer 710 to chuck 712. When ion implantation of the wafer is complete, wafer transfer assembly 819 moves the wafer back to loadlock/delivery tool 814 and the wafer is removed via the slit valve. In the case of a cluster wafer delivery tool, transfer assembly 819 may be the central wafer transport device that is incorporated into such tools.

As illustrated in FIG. 8a, system 700, with chucks 712a, 712b, is mounted within a processing vacuum chamber 816. Turntable 716 is rotated under the control of a rotating drive 717, which, for example, controls rotation of chucks 712a, 712b. Chucks 712a, 712b may tilt upon arms 714a, 714b under control of a tilting drive 719, which, for example, controls tilt of the wafer depending upon a rotational position of beam deflector assembly 813 and/or turntable 716, such that ion beam 811 is incident on the target surface (e.g., wafer 710a).

Beam deflector assembly 813 provides beam scanning in the direction of incident ion beam 811. FIG. 8a shows ion beam 811 scanned to three different positions, 811a, 811b, and 811c. Scanning in a second direction is provided by the rotation of beam deflector assembly 813 about the axis of incoming ion beam 811. The traveling magnetic field may provide a fast scan at about 10-100 Hz, and the mechanical, rotational scan may provide a slow scan at about 0.5 Hz. The angle through which the rotational scan travels depends on the dimensions of the target (e.g., the wafer surface) and the distance between the target and beam deflector assembly 813. In an embodiment, beam deflector assembly 813 rotates through +/−25°.

In order to keep the angle between the target surface and ion beam 811 constant across the scan, wafer chucks 712 may be controlled to rock in synch with rotation of beam deflector assembly 813.

FIG. 8b is a cross-sectional view of implanter system 800. As shown, mounted wafer 710 can be tilted to maintain ion beam 811 at normal incidence throughout the scan.

Conventional implanters are either "single wafer" or batch. Batch implanters were developed to facilitate higher throughput at higher doses, basically by increasing the total workpiece area in order to distribute heating by the ion beam. Particularly at high beam current and/or high beam energy, workpiece temperature limits these conventional implanters. Since the beam is delivering electrical energy to the workpiece (beam current×beam energy), wafer heating results, due to the beam total power and power density arriving on the wafer. Traditional batch implanters use a "disc" array with a number of wafers mounted on pedestals which are arranged in a ring and inclined with respect to the plane of the "disc." The disc rotates at quite high speed (up to 1200 rpm) and wafers are successively exposed to a spot beam which is very much smaller than the size of each wafer. The wafers clamp to their respective inclined pedestals due to centrifugal force. The centrifugal clamping prevents the wafers from flying off and helps conduct heat delivered by the beam away via the pedestal. A second scanning direction is implemented by translating the spinning disc slowly back and forth. Thus an array of wafers (workpieces) is exposed to two approximately orthogonal scanning motions and the whole wafer array is implanted.

FIG. 9a shows a ring arrangement 900 of a batch of wafers that is much smaller than conventional batches. Ring arrangement 900 includes a set of five spokes 902 with e-chucks 912 at the end of each, each e-chuck 912 supporting a wafer 910 (e-chucks not visible beneath wafers 710; see FIG. 9b). The disc rotation (indicated by motion arrow 914) is now the slow scan (compared to conventional batch implanters today where rotation is the fast scan) since the fast traveling field scanner is effectively creating a line or ribbon beam 915 through which each successive wafer 910 passes as ring arrangement 900 rotates. A change in angular orientation of each wafer 910 occurs as it passes through the line scan. Also, if the angular speed (rotation) of the disc is constant, the effective scan speed of each wafer 910 as it is exposed to the line beam will vary across the wafer in the circumferential direction. These undesirable motions can be compensated by counter rotating each wafer 910 so that there is no effective angle change as the wafer passes through the line beam and the circumferential non-uniformity can be compensated by a cosine function applied to the disc rotation so that each wafer 910 has uniform velocity as it passes through the beam or by varying the length or frequency of the line scan as each wafer 910 passes. Since only slow rotation of the disc is required, and thus negligible centrifugal force, e-chucks 912 can be used to hold each wafer 910, resulting in superior wafer cooling. Since each wafer 910 rotates individually, as indicated by rotation arrows 916, the orientation of wafers 910 can be changed without removing them, facilitating "quad" implants (a series of four implants with each wafer rotated 90 degrees in between). Angled implants will be done by tilting the whole disc (i.e., ring arrangement 900) and loading will be done by tilting the disc (i.e., ring arrangement 900) all the way to horizontal. Thus, the small batch implant geometry resulting has all the desirable features of a single wafer implanter, but much more workpiece area to dissipate beam power.

Traditional batch implanters have well known disadvantages due to the incline angle, workpiece angle change with respect to the beam, and high disc rotation speed generating particles which have been proven to cause damage in some delicate implant steps. Ring arrangement 900 avoids these disadvantages. FIG. 9c depicts the same features shown in FIG. 9a, but illustrates rectangular workpieces 918 in lieu of circular wafers 910, shown in FIG. 9a.

Figure 10:
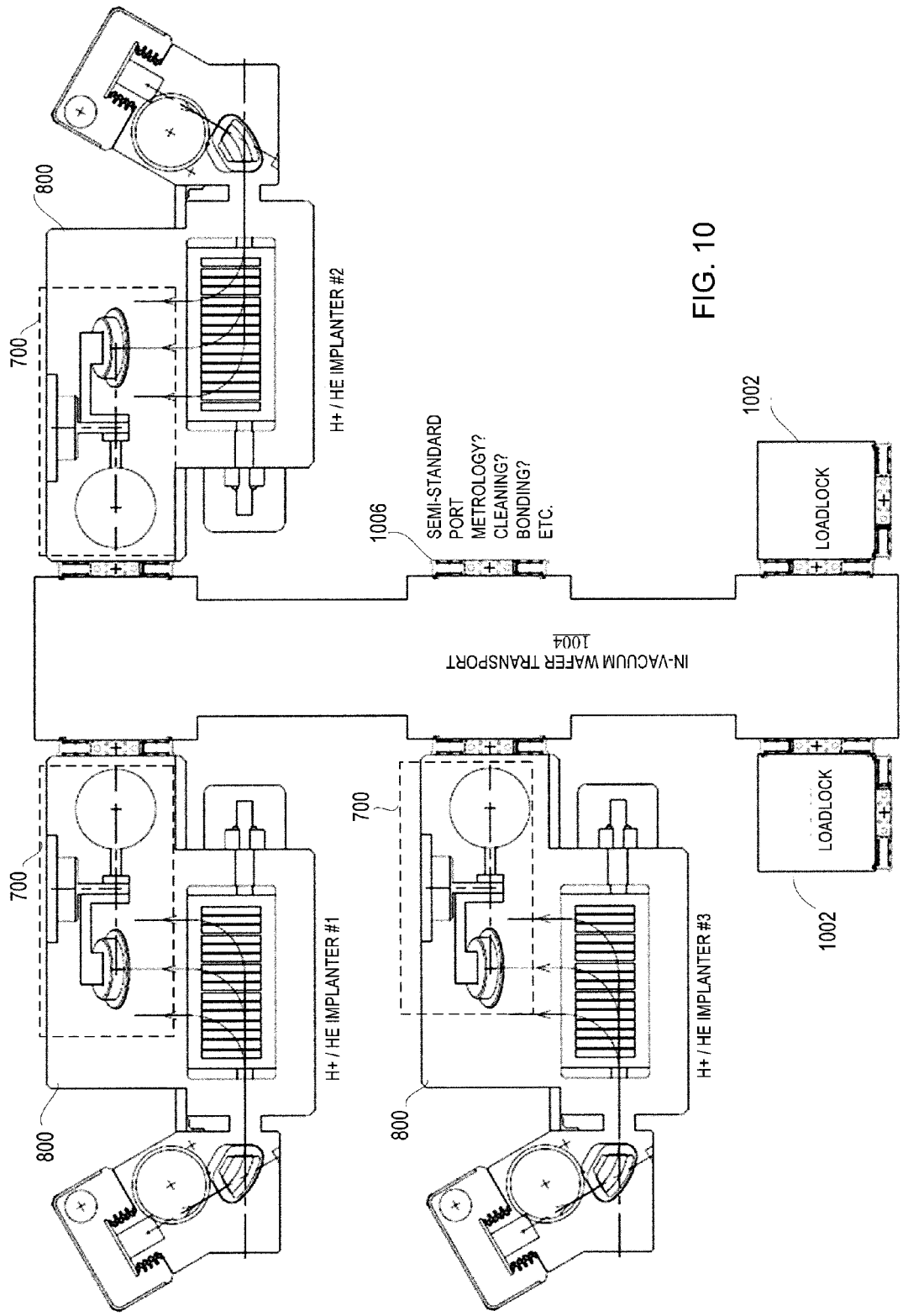

FIG. 10 shows an ion implanter architecture 1000 with a cluster of implanters, specifically, multiple implanter systems 800 with dual-chuck systems 700. As shown, two loadlocks or cluster delivery tools 1002 accept wafers or other workpieces and transfer the wafers or workpieces to an in-vacuum wafer transport 1004, from which the wafers or workpieces are shuttled to implanter systems 800, for example via a semi-standard port 1006. See, e.g., description of loadlock/delivery tool 814 for exemplary functioning of loadlocks 1002. Implanter systems 800 are, for example, high-dose hydrogen and/or helium implanters, to provide layer separation. Alternately, semi-standard port 1006 facilitates connection to other process stations, such as metrology, layer transfer processing, hydrogen and/or helium implant-bond-cleave, and wafer or handle (the substrate to which the separated layer is bonded) cleaning or preparation steps. The low cost, compact application-specific nature of ion implanter architecture 1000 facilitates a complete cycle layer transfer system that includes all required process steps, including separation and bonding in order to produce layer transfer end products in a single cluster tool.

The demand for very high beam currents in order to get good productivity for this process is getting sufficiently great that even state-of-the-art beam current levels are not enough. In addition, wafer cooling creates more and more complexity. An alternative is architecture 1000 with its cluster of low-cost, dedicated implanter systems 800 to achieve very high production capability for high dose implants, for example, as used for silicon layer separation, while staying within presently available beam generation and wafer cooling technology. The most widely used ion species for silicon layer separation is hydrogen, but in some cases a lesser, but still high, dose of helium ions is added. A cluster tool with a number of hydrogen implanter systems 800 plus a helium implanter system 800 avoids the present practice of separate implant steps on different machines with the complexities of wafer handling and transporting in between. The purpose of layer separation implants is to create a buried layer of hydrogen or other atoms which enable the thin silicon layer through which the implanted ions have passed to be separated from the bulk of the wafer. This thin layer of silicon is then usually bonded to another wafer or other substrate surface. In addition to the clustering of ion implant tools as described, process chambers for bonding and the separation (also known as "cleaving" or "exfoliating") steps as well as wafer cleaning, metrology, or other process steps, can lead to improved production yield and equipment and process economies.

Clustering of an ion beam implanter system 800 with a plasma ion implantation tool (not shown) is an example where clustering of low-cost dedicated ion implant tools could lead to other advantages, for example, boron source-drain implants by plasma doping as well as the associated but angle critical source-drain extension by system 800 could be sequenced on a cluster tool 1000 including intermediate steps without the wafers leaving the clean controlled vacuum environment. Combining implant with other process steps is at least difficult and generally impractical with traditional implanters because they are so large and complex. While layer separation is a particular target of interest, many other applications can benefit from combining steps, which becomes practical once the implanter is sufficiently simplified.

Figure 11:
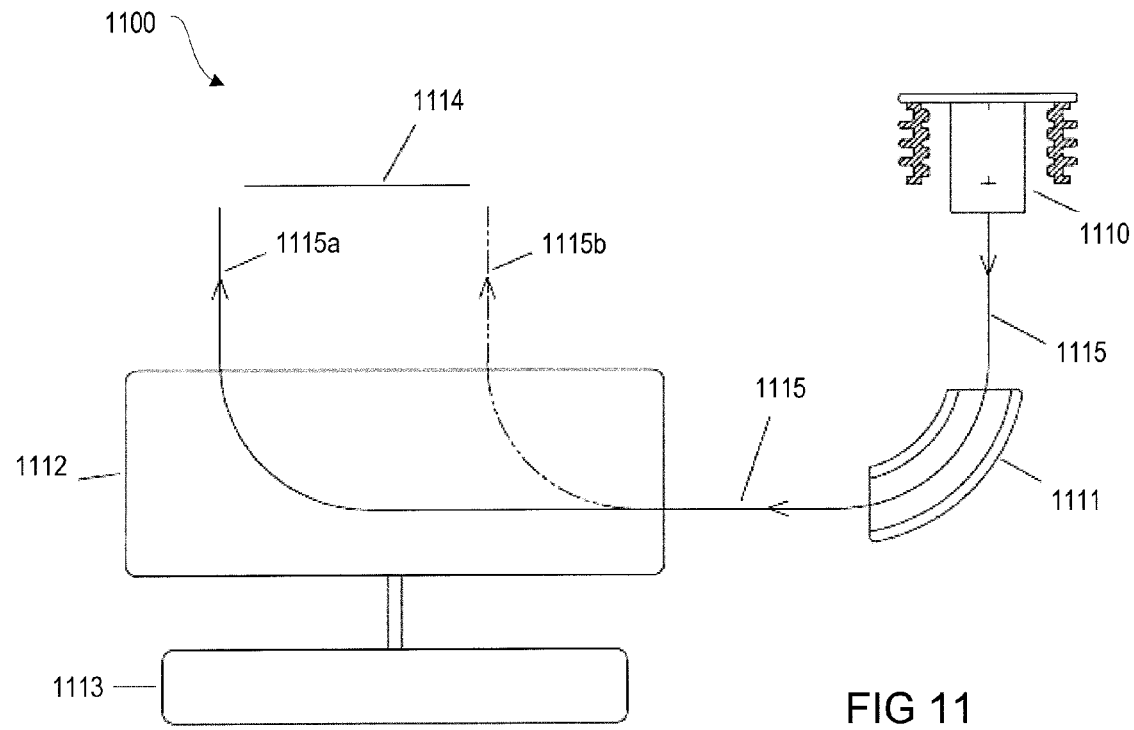
FIG. 11 is a schematic diagram of an ion implant system according to an embodiment.

FIG. 11 is a schematic view of an ion implant system 1100 according to an embodiment. System 1100 includes an ion beam source 1110, an analyzing magnet 1111, a deflector assembly 1112, a deflector control 1113, and a target wafer holder 1114 (e.g., a wafer chuck). An ion beam 1115 is indicated by a line. Although system 1100 is described with respect to ion implantation, system 1100 and other innovations described herein may be used with a charged particle beam, such as an electron beam.

Deflector assembly 1112, for example, bends ion beam 1115 through an angle, e.g., 90° or 270°. Deflector assembly 1112 has a series of individually controlled deflectors arranged along the path of incident ion beam 1115. The individual deflectors each provide either a magnetic field or an electric field across the path of ion beam 1115. Using an appropriate control scheme, deflector assembly 1112 produces a bending field (either magnetic or electric) that moves along the axis of incident ion beam 1115, which is accomplished by controlling the magnitude of the field generated by each of the individual deflectors and by using a plurality of individual deflectors at once.

At least one of the individually controlled deflectors may be an electromagnet. The electromagnets may be formed using superconducting cable. In one embodiment, each individually controlled deflector is an electromagnet, and the electromagnets arranged at about 45° to incident ion beam 1115, for beam deflection through 270°. Alternately, some or all of the deflecting elements may be electrode plates. Deflector assembly 1112 is, for example, operable to energize a plurality of individually controlled deflectors simultaneously.

Figure 12A:
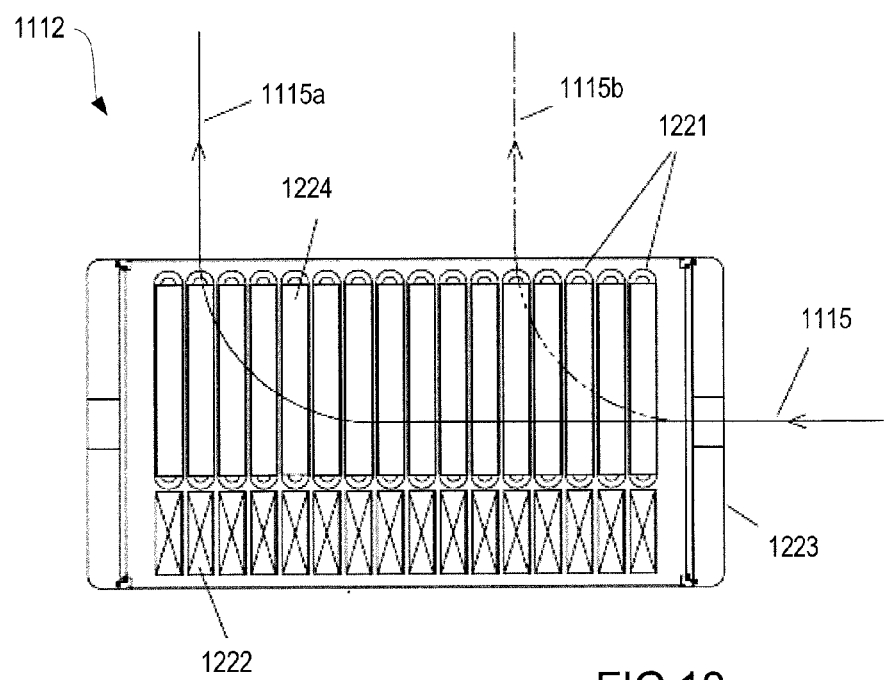
FIG. 12a is a plan view of a deflector assembly according to an embodiment.

FIG. 12a schematically shows one embodiment of deflector assembly 1112. Deflector assembly 1112 includes two rows of opposing coils 1221 wound around a series of poles 1224. Only one row of coils 1221 can be seen in the view of FIG. 12a. Coils 1221 are arranged in a row that extends in the direction of incoming ion beam 1115. FIG. 12a illustrates sixteen such electromagnets. In the condition when all electromagnets are equally energized, ion beam 1115 will be subject to a generally uniform magnetic field and will bend according to beam path 1115b. If the first ten electromagnets are turned off, but all others remain on, beam 1115 will travel further into the magnet array of assembly 1112 before becoming subject to the magnetic field, and will bend according to position 1115a. Each coil 1221 may have an associated power supply 1222 mounted on the same yoke 1223 as the coils and poles 1224. However, in addition or alternately, a remotely mounted power supply 1222 may be connected with coils 1221 by suitable wiring. A controller, such as a computer coupled to each of the deflecting elements, may coordinate the adjustment of the deflecting elements to provide for a substantially continuous sweep of the beam of charged particles (e.g., beam 1115) across the target surface.

Yoke 1223 is, for example, a mechanically movable structure, adapted to rotate about the axis of incoming ion beam 1115. Yoke 1223 is, for example, rotatable between two target positions or to sweep the scanned beam ribbon 1115a-1115b over a workpiece. Alternately or additionally, yoke 1223 is translatable. At least one power supply 1222, for powering the individually controlled deflectors, mounts with yoke 1223. Yoke 1223 may additionally include cooling means for cooling the individual deflectors (e.g., electromagnets).

Figure 12B:
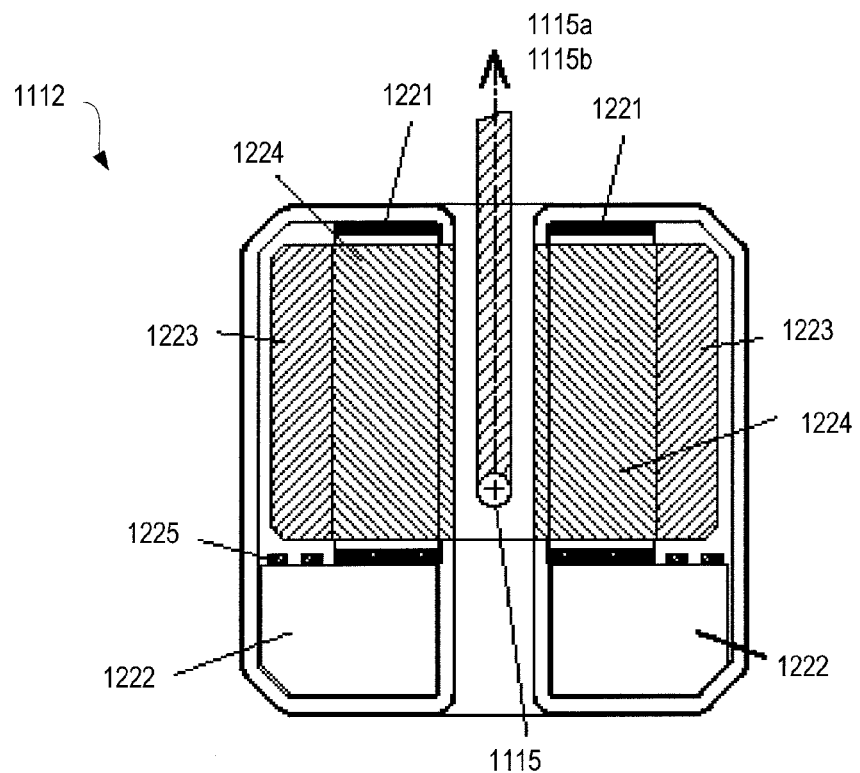

FIG. 12b is a cross-section of deflector assembly 1112 as shown in FIG. 12a, looking along the direction of incident ion beam 1115. FIG. 12b shows opposing sets of coils 1221, positioned on either side of the path of ion beam 1115 to provide a magnetic field through which ion beam 1115 passes. A power bus bar 1225 is also shown in FIG. 12b. Power is delivered through power bus bar 1225 to the power supplies 1222. Similarly, control signals may control each power supply 1222 to adjust the current supplied to coils 1221, and hence the strength of the magnetic field generated by each coil 1221.

Figure 12C:
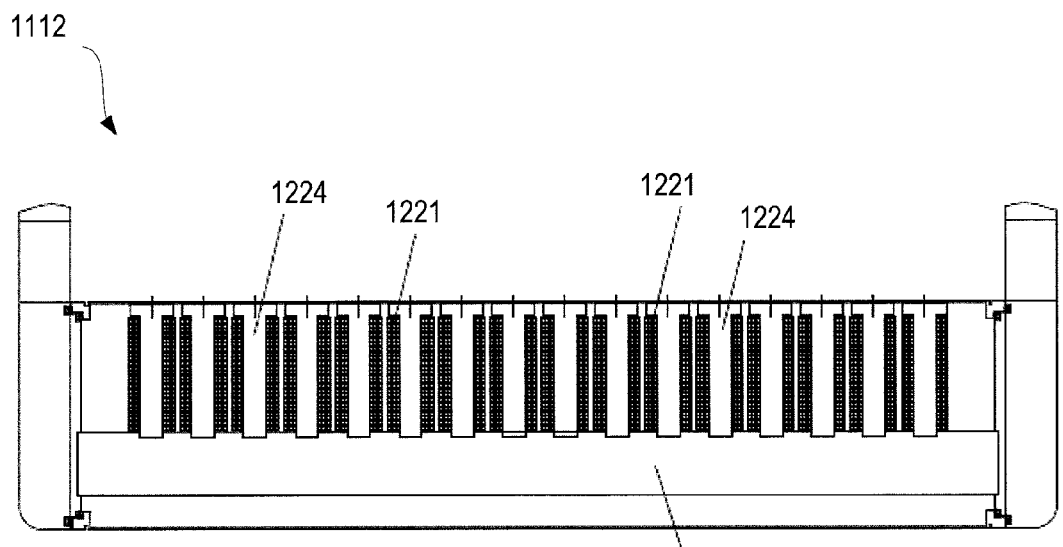

FIG. 12c is a cross-section of one row of coils 1221 and poles 1224. FIG. 12c shows more clearly that, in one embodiment, each coil 1221 is wound around a separate pole 1224 and that the whole array of poles 1224 is mounted on a yoke 1223.

FIG. 11 and FIG. 12a each show ion beam 1115 deflected to two different but parallel paths 1115a and 1115b. The path (1115a, 1115b, or an alternate path) to which ion beam 1115 is deflected depends on the field generated by deflector assembly 1112. The magnetic field can effectively be made to travel up and down deflector assembly 1112 to scan exiting ion beam 1115 across a range of parallel paths.

Rather than simply switching coils 1221 on and off in a sequential fashion, a control strategy may be used to provide a smooth scan of ion beam 1115 by using a plurality of coils 1221 at the same time. The path of beam 1115 can be thought of as being made up of a set of n contiguous bend segments, each segment corresponding to a coil 1221. If each coil 1221 produces a predetermined field, then a predetermined bend angle is achieved after beam 1115 passage through exactly n bend segments. To cause output beam 1115 to scan, the set of bend segments is decremented by one at the entry and incremented by one at the exit, so that the bend is always occurring in n segments. This results in a scan with beam 1115 exiting discontinuously at the end of successive bend segments.

However, it is desirable that beam 1115 scan in a continuous fashion for most applications, which can be achieved by adjusting the fields in the various segments so as to make output beam 1115 exit some fraction 0<(k)<1 of the way across the last of the segments which are participating in the bend. By making k a function of time, k(t), and programming the scan system so that k(t) varies with time continuously from zero to unity, the scan can be made continuous across the entire array of segments. This is illustrated in graph 1330, FIG. 13.

One possible general expression for the relationship between the bend radii and bend angles in the segments 1 to n+1 when the desired bend angle is 90° is in the form of two equations:

$$r_1 + (r_2 - r_1)\cos\alpha_1 + (r_3 - r_2)\cos(\alpha_1 + \alpha_2) + \ldots + (r_{n+1} - r_n)\cos\left(\sum_1^n \alpha_i\right) = R_e \quad \text{Equation 1}$$

$$nw + kw + (r_2 - r_1)\sin\alpha_1 + (r_3 - r_2)\sin(\alpha_1 + \alpha_2) + \ldots + (r_{n+1} - r_n)\sin\left(\sum_1^n \alpha_1\right) = r_{n+1} \quad \text{Equation 2}$$

Where $r_n$ is the radius of bend for each segment, $\alpha_n$ is the bend angle for each segment, w is the width of each segment and $R_e$ is the total effective radius of bend. All of the r, α and k values are understood to be functions of time.

Equation 1 is an obvious geometric requirement and equation 2 results from the requirement that $$\sum_1^{n+1} \alpha_i = \frac{\pi}{2}$$

Figure 13:
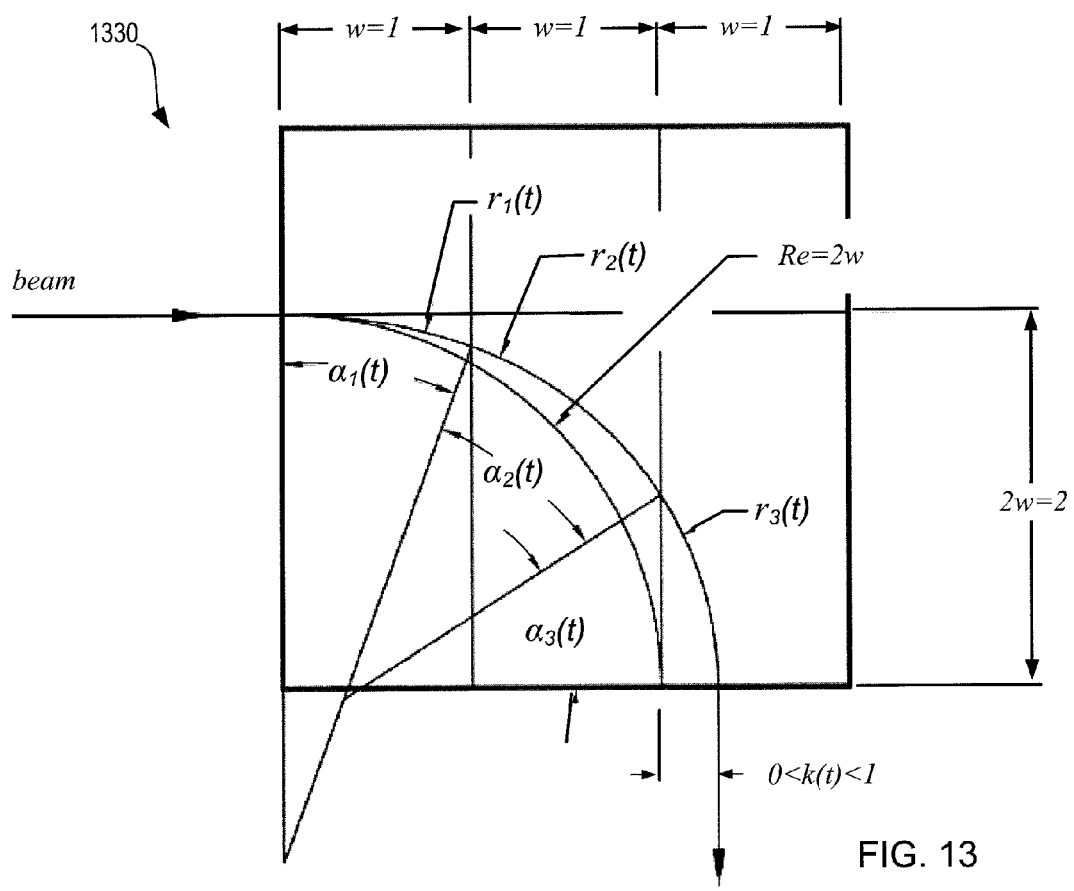
FIG. 13 is a geometrical schematic relating to a basic method of obtaining continuous scanning from an array of discrete bending elements according to an embodiment.

A useful method of applying this principle is to require that the intermediate bend segments $r_2, r_3, r_4, \ldots r_n$ are held at the nominal value, $R_e(=nw)$ (as shown in FIG. 13 for n=2) while adjusting field values in only the first (i=1) and final (i=n+1) segments of the bend. In this case, the equations simplify significantly. Equation 1 becomes, $$r_1(t)+(nw-r_1(t))\cos(\alpha_1(t))+(r_{n+1}(t)-nw)\sin(\alpha_{n+1}(t))=nw \quad \text{Equation 3}$$

and equation 2 becomes $$nw+k(t)w+(nw-r_1(t))\sin(\alpha_1(t))+(r_{n+1}(t)-nw)\cos(\alpha_{n+1}(t))=r_{n+1}(t) \quad \text{Equation 4}$$

Equations of similar form to equations 1 through 4 apply to situations where the bend angle is other than 90°.

Figure 14A:
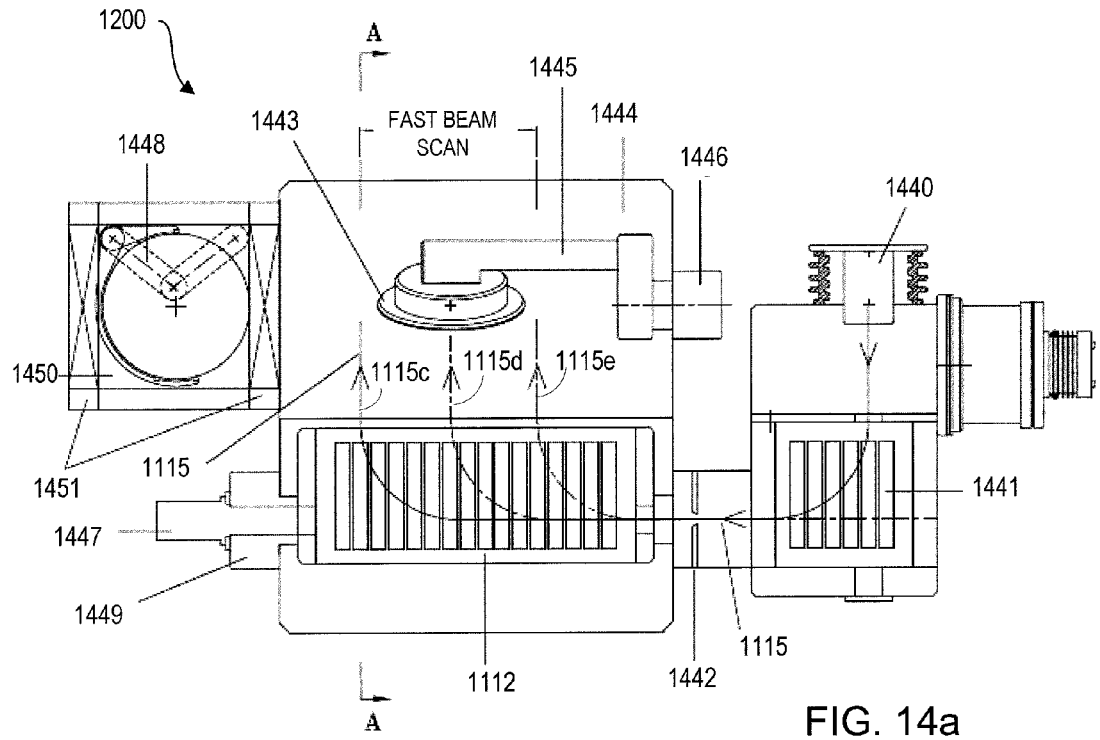
FIG. 14a is a plan view of an implanter architecture including a deflector assembly as shown in FIGS. 12a-12c.

FIG. 14a shows an ion beam implanter architecture for implanting target wafers with ions using a deflector according to an embodiment. An implanter 1200 includes an ion beam source 1440 and analyzer magnet 1441. Analyzer magnet 1441 is shown formed from a series of individually controllable electromagnets, which allows for beam focusing, as explained in more detail below, with reference to FIGS. 17-20. However, analyzer magnet 1441 may also be of a conventional type. Deflector assembly 1112 is of the type shown and described with respect to FIGS. 12a-12c. Ion beam 1115 passes from analyzer magnet 1441 through resolving aperture 1442 into deflector assembly 1112. Deflector assembly 1112 is aligned with the axis of incident ion beam 1115. The yoke (e.g., yoke 1223, not shown in FIG. 14a) with which deflector assembly 1112 mounts is rotatable about the axis of incident ion beam 1115, using a rotation drive mechanism 1449. A suitable drive mechanism may be used, such as a servo motor.

Implanter 1200 includes a wafer chuck 1443 for holding and tilting a wafer. Wafer chuck 1443 is mounted within a processing vacuum chamber 1444 on an arm 1445. Chuck 1443 is tilted under control of a tilting drive 1446.

The deflector assembly 1112 provides scanning of beam 1115 in the direction of incident beam 1115, as described above. FIG. 14a shows ion beam 1115 scanned to three different paths, 1115c, 1115d and 1115e. Scanning in a second direction can be achieved by rotating of deflector assembly 1112 about the axis of incoming beam 1115. The traveling magnetic field may provide a fast scan at about 10-100 Hz, and the mechanical, rotational scan may provide a slow scan at about 0.5 Hz. The angle through which the rotational scan travels depends on the dimensions of the target and the distance between the target and deflector assembly 1112. In an embodiment, deflector assembly 1112 rotates through +/−25°.

Figure 14B:
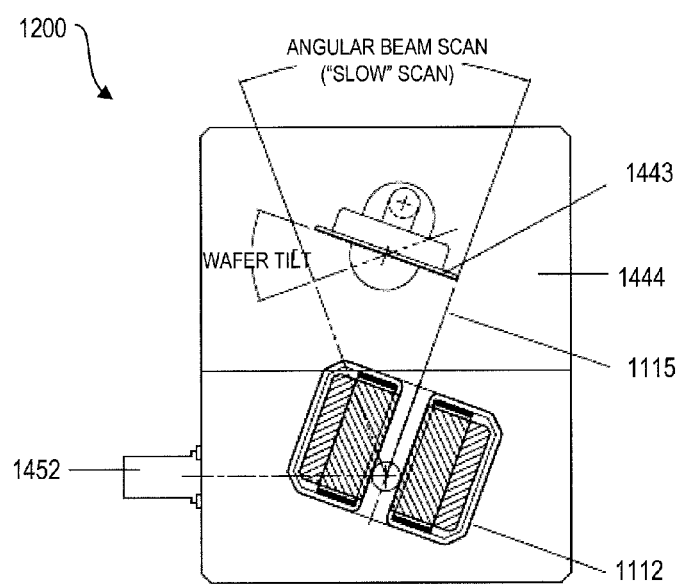

In order to keep the angle between the target surface and beam 1115 constant across the scan, wafer chuck 1443 is controlled to rock in synch with rotation of deflector assembly 1112. This motion is illustrated more clearly in FIG. 14b. FIG. 14b is a cross sectional view along the line A-A shown in FIG. 14a. It can be seen that the wafer can be tilted to maintain ion beam 1115 at normal incidence throughout the scan. Also shown in FIG. 14b is a beam dump 1452, to which beam 1115 is directed when the wafer is being replaced. Beam dump 1452 may extend the full length of deflector assembly 1112 and may be used for beam diagnostics. A "straight through" beam measuring assembly 1447 is also provided to measure and set up beam 1115, e.g., with the scanner off.

FIG. 14a also schematically illustrates movement of wafers to and from wafer chuck 1443. Wafers are loaded into a loadlock 1450 through a slit valve 1451. A wafer transfer assembly 1448 moves the wafer to chuck 1443. When the ion implant of the wafer is complete, wafer transfer assembly 1448 moves the wafer back to loadlock 1450 and the wafer is removed via slit valve 1451.

Figure 15:
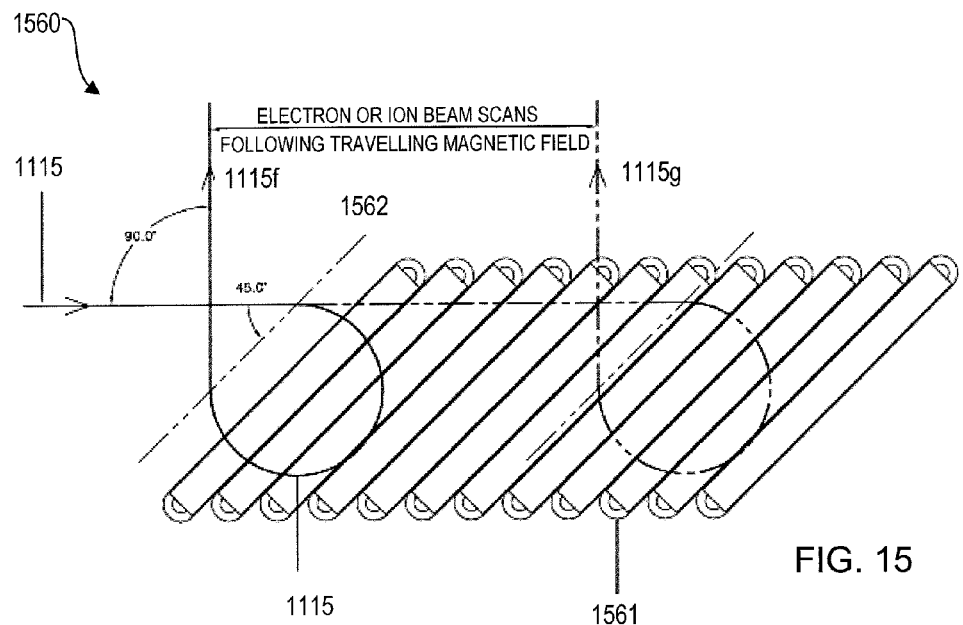
FIG. 15 illustrates an alternative deflector assembly according to an embodiment.

FIG. 15 shows a deflector assembly 1560, for deflecting ion beam 1115 through an angle of 270°. Each of coil/pole 1561 of deflector assembly 1560 is arranged at an angle of 45° to incident beam 1115. Deflection through 270° is useful because particles of a greater range of energies can be retained in beam 1115. Particles of different energies are deflected through a different radius of curvature by the magnetic field generated by deflector elements of assembly 1560, but using the arrangement shown in FIG. 15, they end up traveling on substantially parallel paths. Line 1562 shows the effective field boundary where ion beam 1115 begins to bend. When beam 1115 crosses line 1562 for the second time, bending stops. Particles of lower energy may perform a tighter bend but still turn through 270°. By contrast, particles of different energies deflected by about 90° end up on divergent paths. Beam 1115 may be scanned in a direction parallel to incident beam 1115 by controlling each of coils 1561 in the manner described with reference to FIGS. 12 and 13. FIG. 15 shows beam 1115 scanned to two different paths, 1115f and 1115g.

Figure 16A:
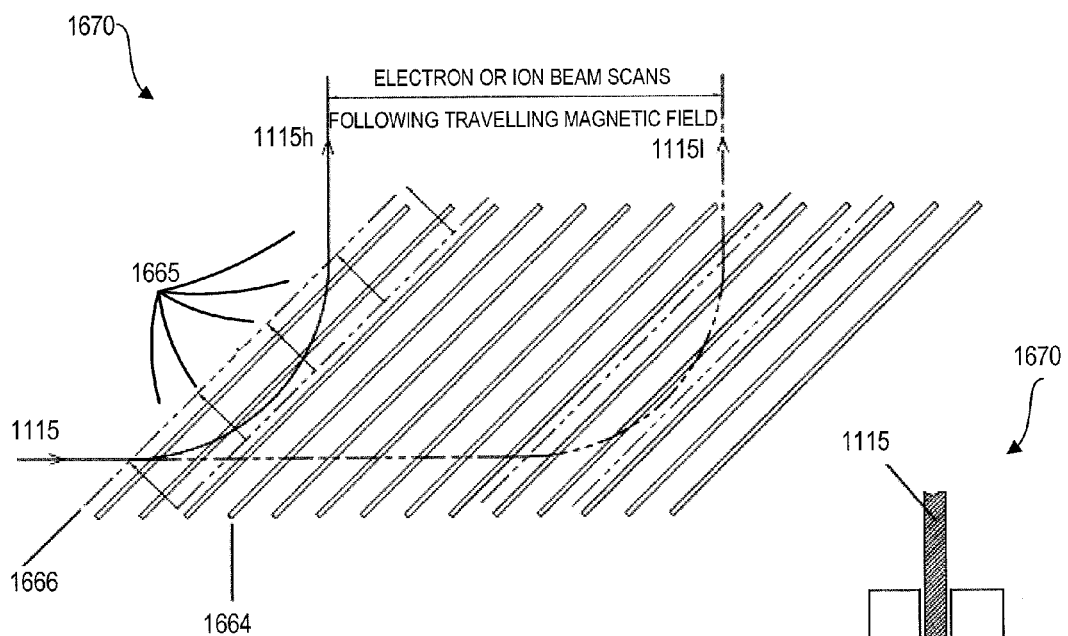
FIG. 16a illustrates a further alternative deflector assembly according to an embodiment.

FIG. 16a illustrates an electrostatic deflector assembly 1670, according to an embodiment. As shown in FIG. 16a, electrostatic deflector assembly 1670 has two parallel arrays of conductive plates 1664 disposed above and below the axis of beam 1115—effectively a set of plates with a slot for the beam to travel. Ion beam 1115 travels between the two arrays, as shown in the cross-sectional view of FIG. 16b. Corresponding pairs of plates 1664 in each array are held at the same electric potential, as indicated by electrical connection 1667, in order to establish an equipotential plane across the beam gap. Successive (adjacent) pairs of plates 1664 are set at different potentials and effectively act as electrostatic mirrors and deflect charged particles as a result of the electric field generated between adjacent plates 1664 in each array. The direction of the electric field is shown by lines 1665 in FIG. 16*a*, and the effective field boundary by line 1666.

Figure 16B:
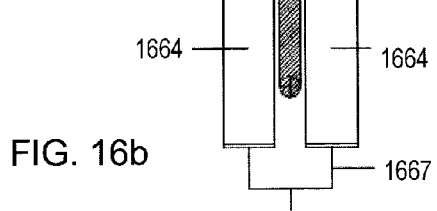

In the embodiment of FIGS. 16*a*-16*b*, plates 1664 are positioned at 45° to incident ion beam 1115. Other angles may be chosen in order to deflect the ion beam through different angles.

By controlling voltage applied to each of plates 1664, deflected ion beam 1115 can be made to scan in the same manner as described with respect to deflector assembly 1112, shown in FIGS. 12*a*-12*c*. Beam 1115 is shown in two paths 1115*h* and 1115*i* in FIG. 16*a*. A smooth scan may be achieved by energizing a plurality of adjacent plates 1664 within each array at any one time. The same considerations in this regard apply to an electrostatic deflector assembly 1670 as to the magnetic deflector, i.e., deflector assembly 1112.

Electrostatic deflector assembly 1670 of FIGS. 16*a* and 16*b* may be mounted on a yoke and rotated or translated in the same manner described with respect to deflector assembly 1112, e.g., as shown in FIGS. 14 and 15.

A deflector assembly according to an embodiment may be used not only to scan a charged particle beam across a target surface, but also to focus an otherwise divergent charged particle beam during a scanning process. The same basic principles can be applied to analyzer magnets (e.g., magnet 1441) as shown in FIG. 14*a*. The analyzer magnet, for example, selects an ion species and provides limited focusing of that species.

Figure 17A:
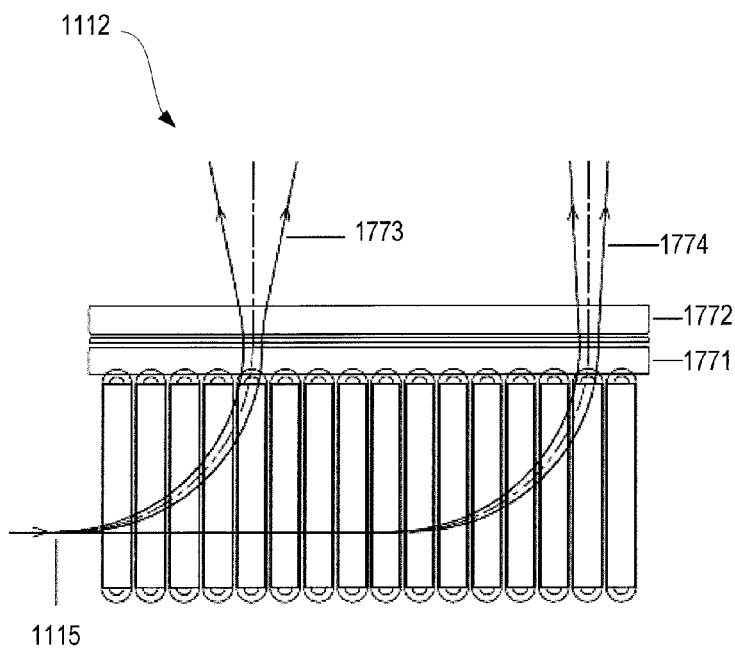
FIG. 17a illustrates a focusing function of a deflector assembly in conjunction with a deceleration arrangement according to an embodiment.

FIG. 17*a* shows deflector assembly 1112 of FIG. 12, in conjunction with an arrangement of electrodes 1771, 1772, used for decelerating ion beam 1115. Some applications may require a particle beam having a high beam current but a low beam energy. At low beam energy, ion beams suffer from greater beam divergence due to space charge effects. To minimize this problem, the beam can be passed through the implanter with relatively high energy and then decelerated just prior to reaching the target. Assembly 1112 decelerates beam 1115 using a set of retarding electrodes 1771, 1772 arranged along the beam path. An electric field generated between electrodes 1772 and electrodes 1771 slows the charged particles. In the embodiment shown in FIG. 17, electrodes 1771, 1772 extend along the length of deflector assembly 1112.

When beam 1115 is decelerated, it diverges. The shape of beam 1115 without beam focusing is shown in a left beam position 1773, in FIG. 17*a*. However, deflector assembly 1112 may be controlled to reduce beam divergence, as shown in a right beam position 1774. In order to reduce beam divergence, particles on the left edge of beam 1115 need to be deflected through a smaller angle than particles on the right edge of beam 1115. By energizing deflecting element coils (e.g., coils 1221, FIG. 12*a*) to the left of the centerline of beam 1115 less, and those to the right of the beam centerline more, a field gradient which is lower on the left and higher on the right is created across the width of beam 1115, thus deflecting elements can be controlled to provide a different bend radius for different parts of beam 1115 while maintaining the required bending field value at the beam centerline. Similarly, the gradient can be high on the left and low on the right, which will defocus in the scanning plane but focus in a plane perpendicular to the scanning plane. The result is a focusing condition which can follow the scanning beam. The spatial and temporal distribution of the bending field generated by the deflector assembly can be controlled to achieve focusing by varying the amount and duration of the current supplied to each deflecting element coil. Computer modeling may be used to calculate the required control strategy, which is dependent on the amount of beam divergence.

Figure 18:
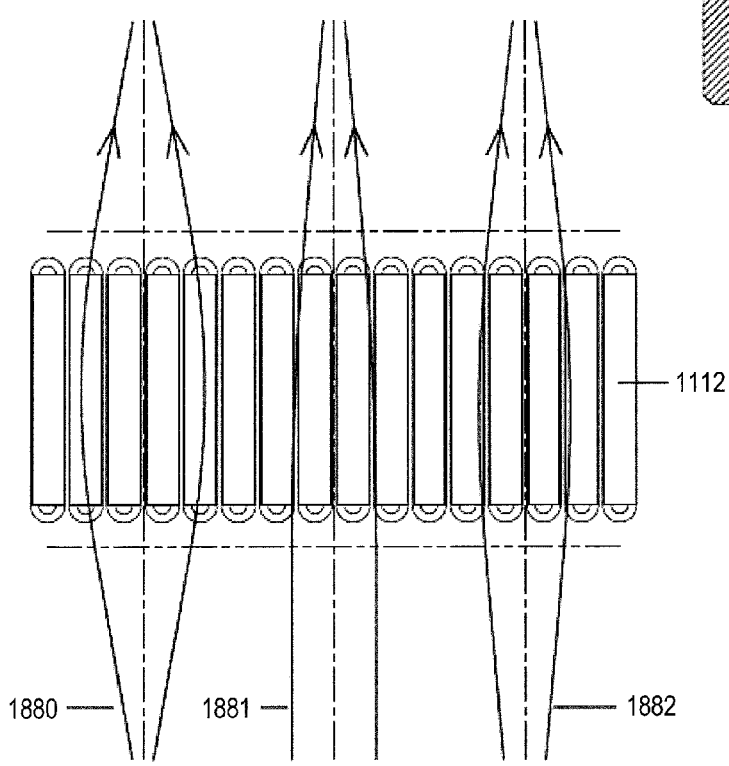
FIG. 18 illustrates a deflector assembly used for focusing a charged particle beam according to an embodiment.

FIG. 18 illustrates how a deflector assembly according to an embodiment can be used to focus a scanning ion beam without itself performing the scanning function. Since a linearly scanned beam basically forms a ribbon, such ribbon beams formed by means other than scanning can also be used. Deflector assembly 1112 is of the same type as described with reference to FIGS. 12*a*-*c*. FIG. 18 illustrates beam focusing on three different charged particle (ion) beams 1880, 1881, and 1882. By producing a particular field profile within deflector assembly 1112, different parts of the beam (e.g., beam 1115, not shown) can be subjected to different bending fields to provide focusing, which is particularly easy if the width of the beam as it passes through the deflector assembly is greater than the width of a single deflecting element, although this scenario is not a necessary condition for focusing to work. The three differently shaped beams 1880, 1881, and 1882 illustrate the deflector assembly's ability to provide focusing that is variable with scan position, potentially to correct for beam optical changes at different parts of the scan range. As a beam is scanned across a target, the focusing field generated by the deflector assembly can follow the beam to provide the required focusing.

A deflector assembly such as assembly 1112 may therefore provide focusing in the scanning direction. Focusing normal to the scanning direction can be provided using conventional electrostatic plates.

Figure 17B:
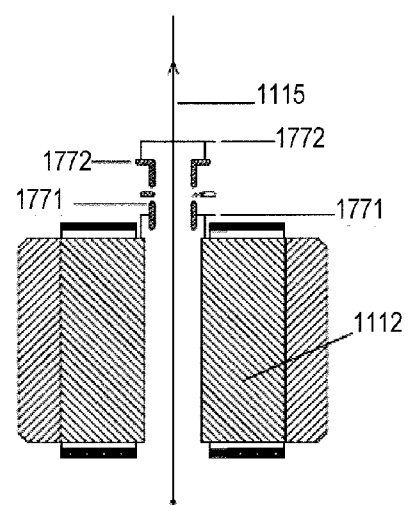
Figure 19A:
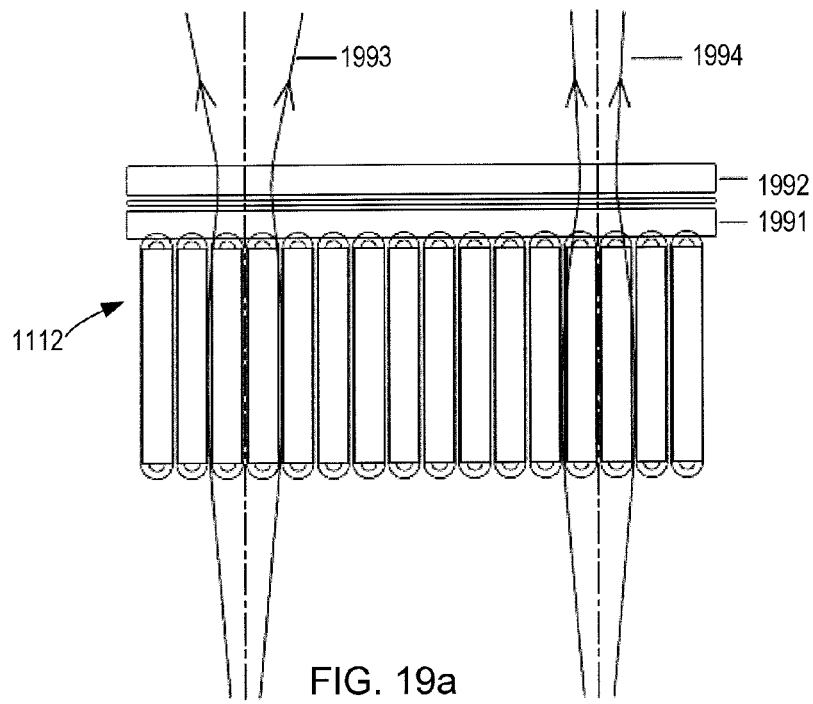
FIGS. 19a and 19b show the deflector assembly of FIG. 18 in combination with a deceleration arrangement.
Figure 19B:
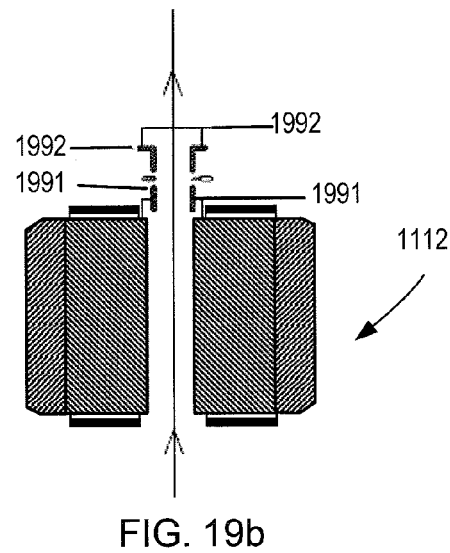

FIGS. 19*a* and 19*b* show deflector assembly 1112 of FIG. 18 with a deceleration electrode arrangement 1991, 1992 of the type shown in FIG. 17. FIG. 19*b* is a cross-section of assembly 1112 as depicted in FIG. 19*a*. As in FIG. 17, two beam positions are shown. A left hand position 1993 shows the beam with no focusing, and a right hand position 1994 shows the beam with focusing applied.

Figure 20:
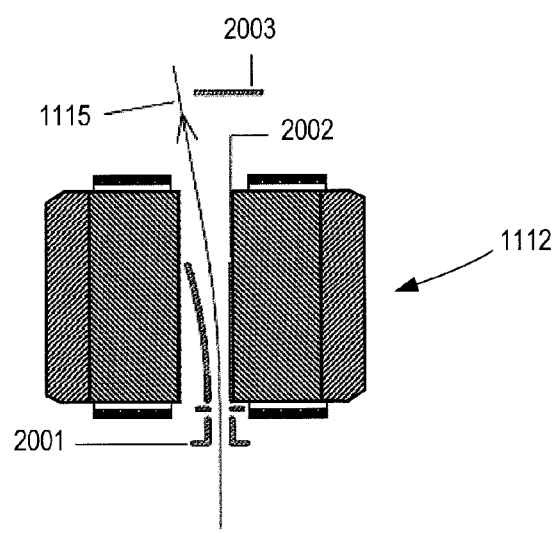
FIG. 20 illustrates a neutral stop arrangement according to an embodiment.

Another problem with deceleration of an ion beam using electric fields is that neutralized ions, which occur in varying degrees in most ion beam systems, are not decelerated and so will hit the target at higher energy than desired. Ions can become neutralized at any time after ionization by combining with electrons trapped in the ion beam or stray electrons in the processing chamber. FIG. 20 is a cross-sectional view like that of FIG. 19*b*, showing an alternative arrangement of deceleration electrodes 2001, 2002, for use with a scanning charged particle beam. The deceleration electrodes 2001, 2002 are shaped to deflect a beam of charged particles slightly. Neutralized particles will not be deflected and so will continue on a straight path and collide with a neutral stop plate 2003. In the example shown in FIG. 20, deceleration electrodes 2001, 2002 are positioned within deflector assembly 1112, which represents a possible position providing a compact configuration. Electrodes 2001, 2002 may also be positioned subsequent to deflector assembly 1112.

Scanning systems according to an embodiment may be scaled to particular applications. Large implant workpieces, such as of the order of 2 meters in length and larger, are becoming widely used for flat panel displays. Also, some solar panel technologies may require ion implantation of large panels of several square meters in area. The present deflector assemblies are ideally suited for ion implanting on such scales. Conventional machines, which move the targets to provide scanning, are clearly not well-suited to large workpieces. Existing two-dimensional beam scanners would require complicated and highly accurate optics to be able to cope with such large workpieces. Applications using electron beams to produce scanning beams of x-rays or other radiation for processing or imaging especially large workpieces are also particularly suited to systems in accordance with the present invention.

The present charged particle beam scanning systems offer several advantages over conventional scanning systems, such as at least: scanning systems according to the present invention are easily scalable for different applications; charged particle beams can be variably focused throughout a scan; a charged particle beam can be scanned over a planar surface with the same angle of incidence throughout the scan without the need for complicated optics; and the scanning system according to the present invention allows for a compact implanter design.

Beam Sweep

Figure 21:
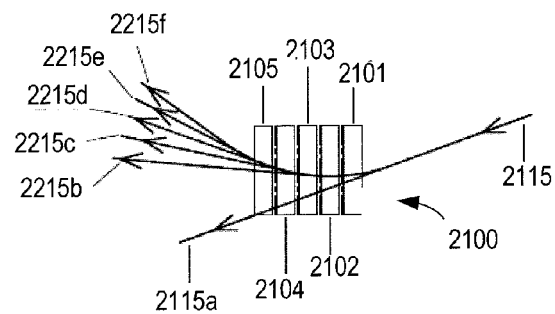
FIG. 21 shows one exemplary scanning (sweep) magnet where the main scanning effect results from time varying of distance, according to an embodiment.

The bending of charged particles in a magnetic field is primarily determined by the magnetic field strength B, and the distance over which B is acting upon the particle. The product of these parameters is commonly referred to as "Bdl" where B is the field strength and dl is "delta length" or distance over which the field is present. A higher Bdl value will bend a charged particle of a particular mass and energy more either because the B value is higher resulting in a smaller bend radius, or the dl value is higher resulting in a larger bend angle, or both. Scanning of ion beams is commonly achieved by passing the beam through a magnet which has a time varying B field value; as the field goes higher the bend radius reduces. In such a scanning magnet the dl value remains approximately constant. FIG. 21 depicts a scanning (sweep) magnet 2100 where the main scanning effect results from time varying of dl. Magnet 2100 in combination with a corrector magnet such as 2202 or 2203 may be used within implanter 100, FIG. 1a, in place of beam deflector assembly 13, and similarly used within other exemplary implanter embodiments disclosed herein. An ion beam 2115 is directed between the poles pairs of scanning magnet 2100 formed by an array of magnet poles 2101-2105 (each with its own set of energizing coils as described previously). If no energizing is applied to any of the poles 2101 to 2105, the field will be zero and the beam will pass straight through (2115a). With pole pair 2101 energized to a field value B, the beam 2115 is bent and emerges per 2115b. With pole pair 2102 energized to the same value as 2101, dl is now approximately doubled and the emerging beam position moves to 2115c. Similarly, if pole pair 2103 is energized to the same value as 2101 and 2102, the dl is approximately three times and the beam will emerge at 2115d, and so on. In this example, beam 2115 will step from one "fixed" position to the next, determined by the dl increment contributed by each pole pair. This step can be smoothed out by ramping the B value up or down in a controlled manner such that the effective dl continuously grows between the finite steps determined by the poles 2101-2105.

Figures 22, 23:
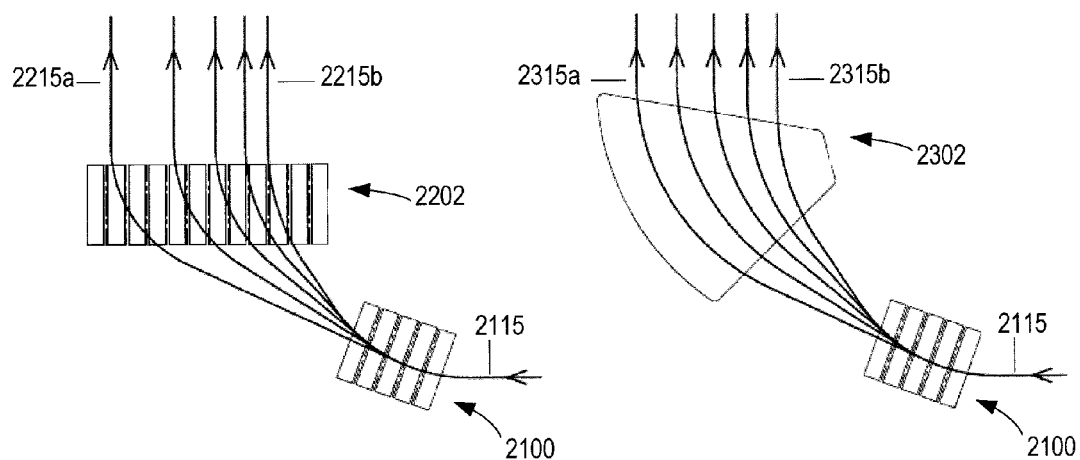
FIG. 22 shows the scanning magnet of FIG. 21 in conjunction with a second "corrector" pole array, according to an embodiment.
FIG. 23 shows the scanning magnet of FIG. 21 arranged in conjunction with a corrector magnet, according to an embodiment.

If a workpiece is placed in a manner to intercept beams 2115b-2115f, the workpiece will be impinged by the beam at significantly different angles as it scans. In many cases this result is undesirable, and scanned beams are usually subject to a further ion-optical element to bring the beam scan parallel. FIG. 22 shows scanning magnet 2100 in conjunction with a second "corrector" pole array 2202. Magnets 2100 and corrector pole array 2202 may be used within implanter 100, FIG. 1a, in place of beam deflector assembly 13, and similarly used within other exemplary implanter embodiments disclosed herein. In this arrangement, the bend radius within array 2202 varies from left to right with a larger radius at 2215a, and a smaller radius at 2215b. The dl value in 2202 is approximately constant, and the graduation of bend radius required can be achieved by profiling B. Simultaneously, gradients of B across the beam width can be introduced to provide some beam focusing, as discussed above, to control beam spot size and incident angle on the workpiece. Scan uniformity can be controlled by profiling the scan speed.

In FIG. 23, the scanning magnet 2100 is arranged in conjunction with a corrector magnet 2302 of a conventional type. Magnet 2100 and corrector magnet 2302 may be used within implanter 100, FIG. 1a, in place of beam deflector assembly 13, and similarly used within other exemplary implanter embodiments disclosed herein. This type of corrector uses a fixed (not time varying) field and dl is also fixed although one or both of dl and B are usually graduated over the scan width to achieve beam positions 2315a through 2315b.

It should be noted that, although relatively simple magnet shapes are used to illustrate the novelty and advantages of pole array magnets for beam management, actual designs may incorporate more complicated features, without departing from the scope hereof. Although the pole array magnet devices (2100, 2202) described herein are disclosed for use with scanning beams, many can be applied to ribbon beams. Corrector 2202 illustrates such an example.

Shelf Shielded Magnet

High voltages associated with the generation and management of beams of charged particles are frequently of large enough magnitude that X-radiation (X-rays) is unavoidably generated. Measures must be taken to contain the X-rays which otherwise can represent a serious health hazard for people using the equipment. Ion sources are a typical source of X-rays and extensive shielding using materials with high atomic numbers such as lead or tantalum is usually required in the vicinity of the ion source, and especially around beamline components immediately downstream from the ion source, such as an analyzing magnet. Significant shielding material costs, plus the important need for radiation safety, often lead to costly X-ray monitoring and interlock equipment to ensure that the equipment is not run accidentally without shielding in place.

Figure 24:
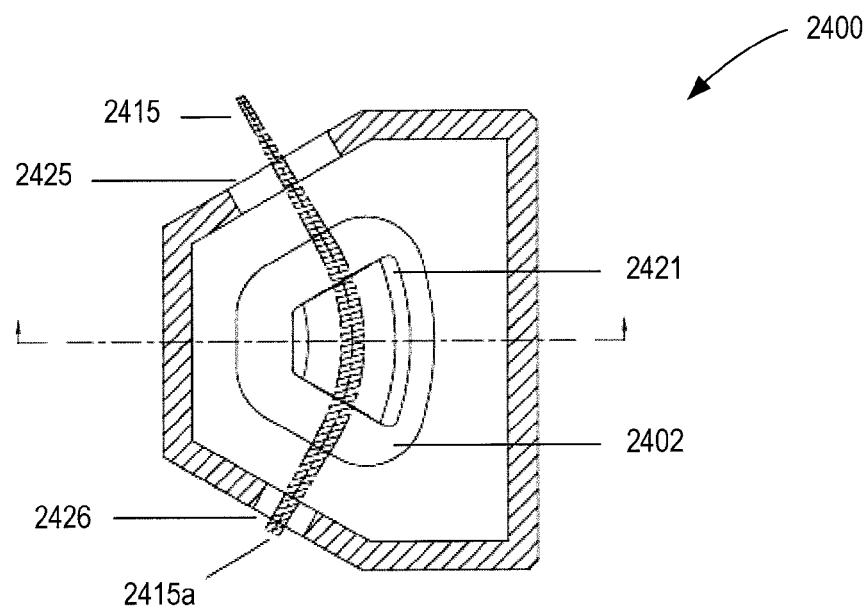
FIGS. 24 and 25 show an exemplary configuration whereby the magnet return yoke is configured as a largely closed iron box in order to trap X-rays injected into the magnet from the ion source port, according to an embodiment.
Figure 25:
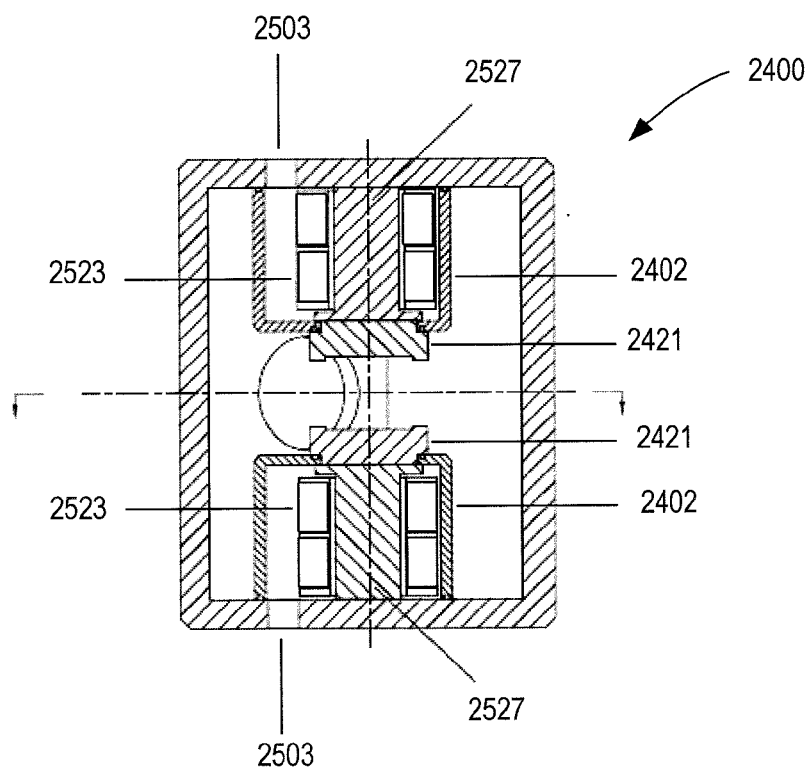

In a typical ion beam generation system, the ion beam which originates from the ion source is directed immediately into an analyzing electromagnet which separates unwanted beam constituents. The magnetic flux created between the iron poles by the excitation of the electric coils is coupled through an iron "return yoke" which is usually quite massive, and thus able to contribute to X-ray attenuation if it was suitably configured. However, in traditional designs the return yoke is configured so that it provides very limited shielding, losing an advantage in cost and complexity regarding radiation management. FIG. 24 shows one exemplary x-ray shielding analyzer magnet 2400. FIG. 25 shows a cross-section through analyzer magnet 2400. Analyzer magnet 2400 may be used within implanter 100, FIG. 1, in place of analyzer magnet 12, and may be similarly used in other implanters disclosed herein. In analyzer magnet 2400, the magnet return yoke is configured as a largely closed iron box in order trap X-rays injected into the magnet from the ion beam source port 2425. Another advantage of this configuration is that the iron box also functions as the vacuum housing which is traditionally a separate assembly, further reducing costs and simplifying the overall assembly.

The magnet illustrated has a bend angle of 60 degrees, but could be any value. Typical analyzer magnet bend angles range from 30 to 120 degrees. FIG. 24 is a section through the median plane of the magnet and shows the return yoke/vacuum box wall surrounding the 60 degree pole. For clarity, the beam 2415-2415a is depicted without illustrating the separated, unwanted beam constituents which bend through angles that are more or less than the main beam, and consequently can be blocked and not delivered to the exit port 2426. The poles 2421 are shaped to produce the required magnetic field configuration and are magnetically connected to the return yoke via iron cores 2527. The energizing coils 2523 are shown in a non-magnetic hermetic housing 2402 so that they do not operate in vacuum, and electrical and cooling connections can be easily made via small ports 2503. Optionally, the coils can be mounted in a vacuum and each connection individually hermetically sealed. FIG. 25 is a section through the centerline of FIG. 24 and thus shows the complete magnetic flux path as well as emphasizing the closed box configuration of the return yoke. Iron is not as effective as lead for X-ray shielding, but in many cases the iron thickness will be sufficient or can be easily adjusted so that no additional shielding material is required. Generally, it will be much more cost effective to increase the yoke thickness beyond the requirement of the magnetic flux alone rather than add separate additional shielding.

Other sources of X-rays such as those generated from accelerator gaps can be managed by variations on this basic concept including focusing magnets such as quadrupole, sextupole, and steerer designs, which employ an external box structure return yoke and/or vacuum housing.

Spin Scan

More efficient utilization of the ion beam in the present system has other significant advantages. In an ideal scanning method, the beam would only impinge on the wafer chuck (workpiece) and none of the beam would be wasted by overscanning. However, in practice, the beam must not reverse direction while on the wafer because an over-exposure will occur at the turn-around point, since the beam must come to rest for a moment. In principle, superior beam utilization is achievable by spinning the wafer around its own center, combined with linear scanning of the beam spot along a diameter or parallel to a diameter. This geometry has an inherent problem that a singularity occurs at the very center (of rotation) of the wafer and an overdose results at that point. Techniques have been proposed to mitigate this problem and are not part of the scope of this invention.

Figure 26:
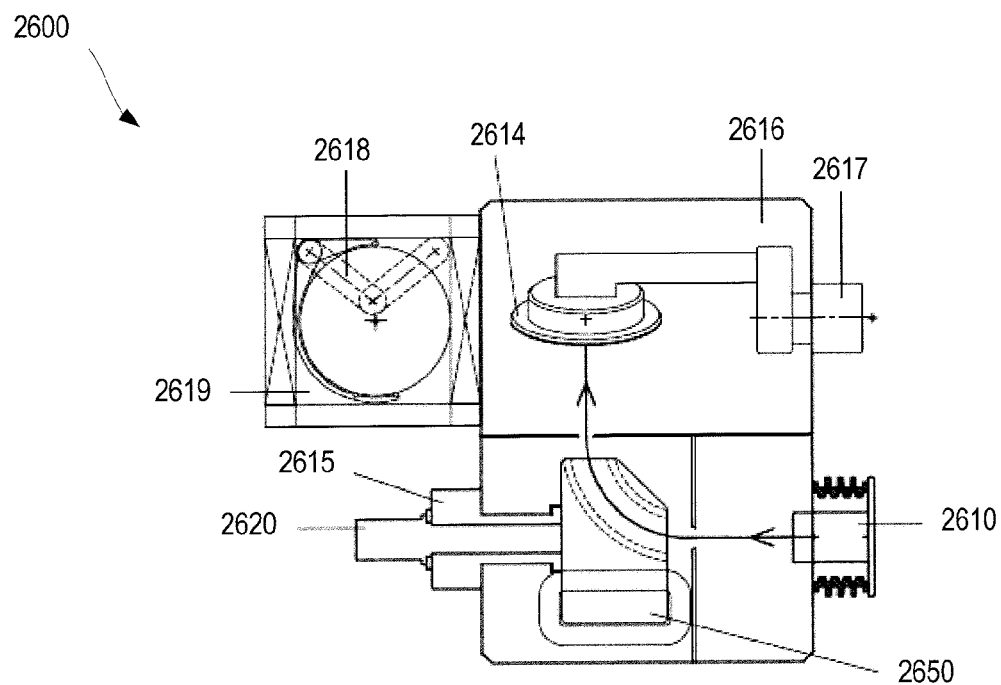
FIGS. 26 and 27 describe a very simple implanter with an absolute minimum of components achieved by combining a spinning wafer chuck with an angular scan to implement a linear scan, according to an embodiment.
Figure 27:
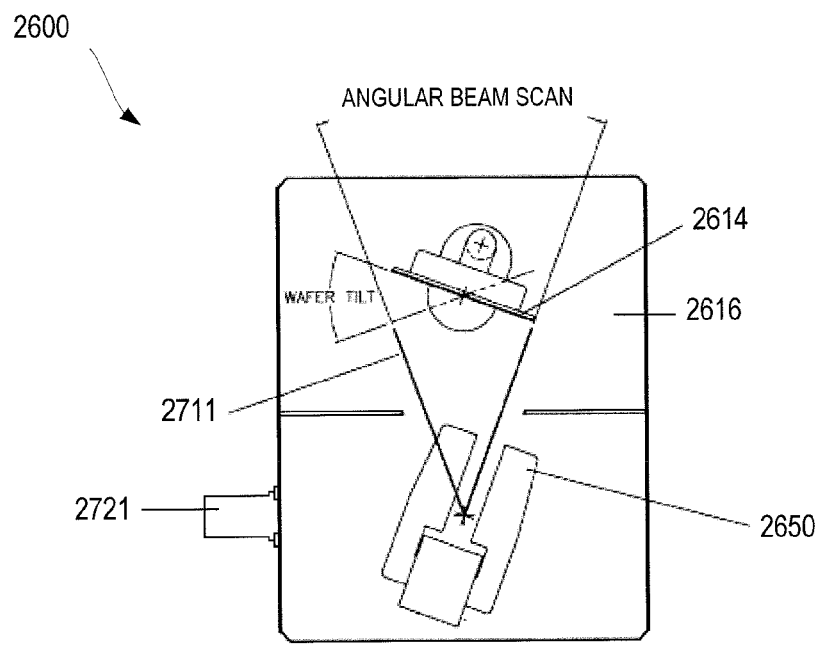

FIGS. 26 and 27 describe a very simple implanter 2600 with an absolute minimum of components, achieved by combining a spinning wafer chuck 2614 (workpiece) with the angular scan previously described to implement the linear scan. Implanter 2600 includes a wafer transfer assembly 2618, a processing vacuum chamber 2616, a tilting drive 2617, an ion beam source 2610 generating an ion beam 2711, a "straight through" beam measuring assembly 2620, a rotation drive mechanism 2615, a loadlock assembly 2619, and a beam dump 2721. A single 90 degree magnet 2650 is used as both an analyzer magnet and angular scanning device.

An alternative spin-scan implementation can be applied to implanter 100, FIGS. 1*a* and 1*b*, by enabling the wafer chuck 2614 to spin and utilizing the beam deflector assembly 13 to achieve the linear scan across the wafer. In this case, angular scanning of deflector assembly 13 would not be required. The embodiments disclosed herein, which effect linear scanning of the beam by travelling field or other methods, may be used in conjunction with wafer spinning.

Split Pole

Figure 28:
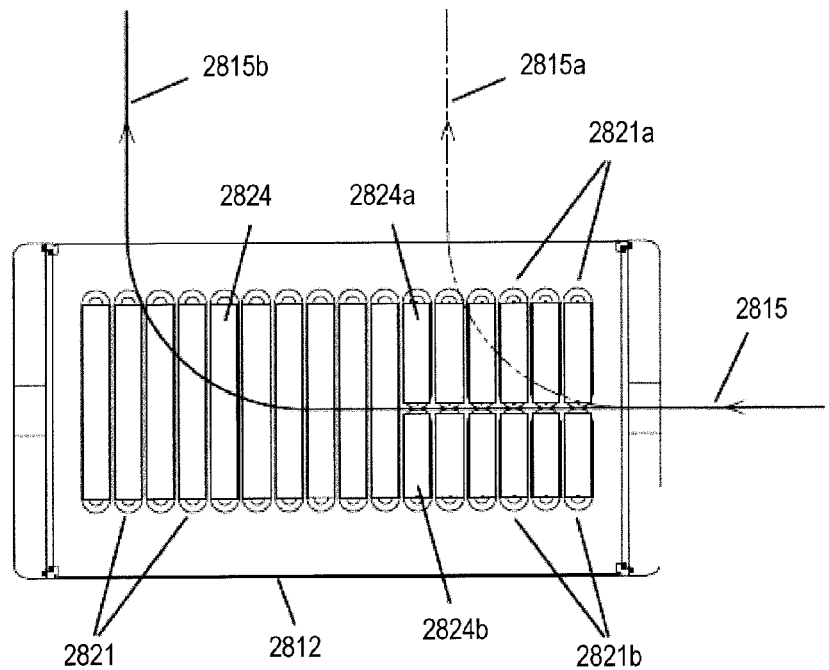
FIG. 28 shows one exemplary deflector assembly where some of the magnet poles are split at the incoming beam centerline, according to an embodiment.

An aspect of travelling field beam scanning is the change in path length travelled by the beam from one scan extent to the other. Since ion beam particles carry like electrical charges, they repel each other leading to "space charge expansion" of the beam as it progresses. In general, the farther a beam travels, the larger it will become. A large change in beam spot size over different parts of the wafer (workpiece) is undesirable. The spot (beam) size is usually controlled by focusing elements such as quadrupole magnets or electrostatic lenses. In the case where the beam path length varies, focusing must be dynamic and follow the beam scan (path length change). FIG. 28 shows one exemplary embodiment of a deflector assembly 2812 where some of the magnet poles 2824, which are energized by controlling the electric current in coils 2821, are split at the incoming beam 2815 centerline and each of the smaller poles 2824*a* and 2824*b* is individually energized by controlling the current in coils 2821*a* and 2821*b*. Deflector assembly 2812 may be used within implanter 100, FIG. 1*a*, in place of beam deflector assembly 13, and similarly used within other exemplary implanter embodiments disclosed herein. When the split pole sets 2824*a* and 2824*b* are energized together they act upon the beam in a manner essentially identical as a single pole set 2824. As the scanned beam progresses from 2815*a* to the longer path length 2815*b*, the input pole sets are successively turned off as described elsewhere and no longer play a part in the scanning action. If a split pole set 2824*a* and 2824*b* is energized with opposite polarity, the magnetic field at the beam input centerline can be maintained at zero so no bending (scanning) contribution takes place, but left and right of the centerline a field of increasing/decreasing value occurs. The quadrupole field formed in this way can be used to apply focusing to compensate for the beam spot size change arising from the increasing path length.

Figure 29:
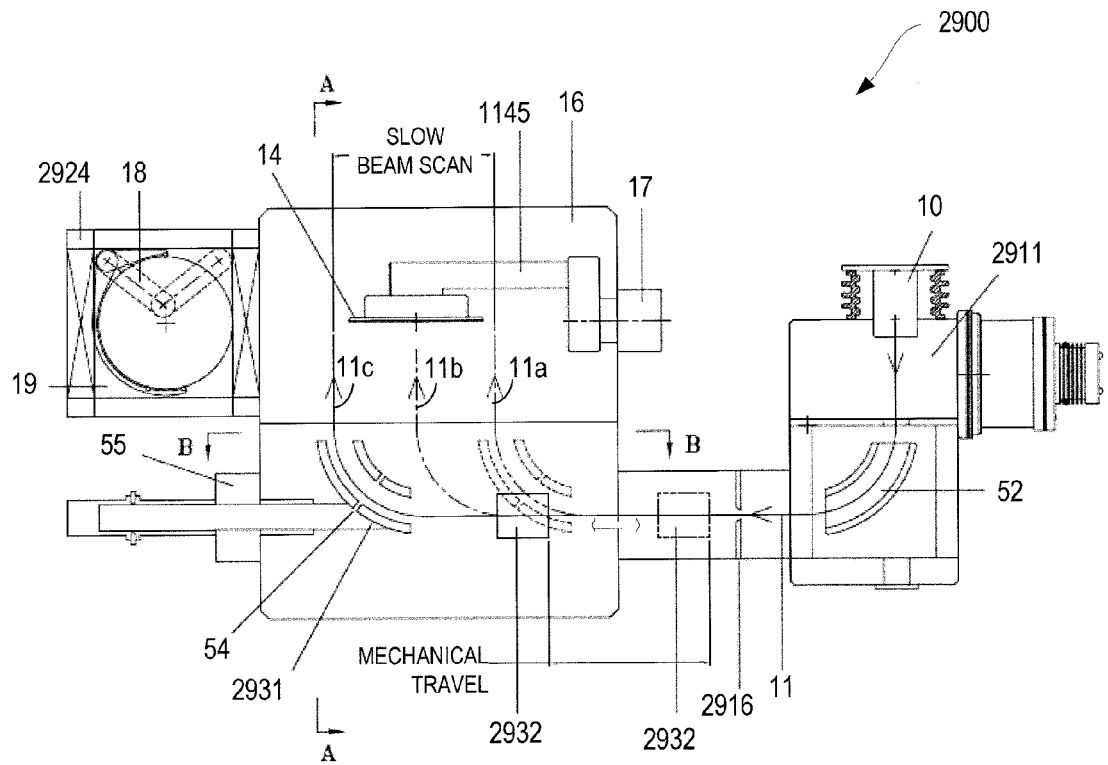
FIG. 29 is a schematic illustration of an implant system incorporating a second embodiment of a scanning system according to an embodiment.

FIG. 29 shows one exemplary ion implant apparatus 2900 for multi-directionally scanning a beam of charged particles across a target surface, according to an embodiment. The basic architecture of apparatus 2900 is similar to that shown in FIG. 5*a*, and like elements are indicated using the same reference numerals.

Figure 31:
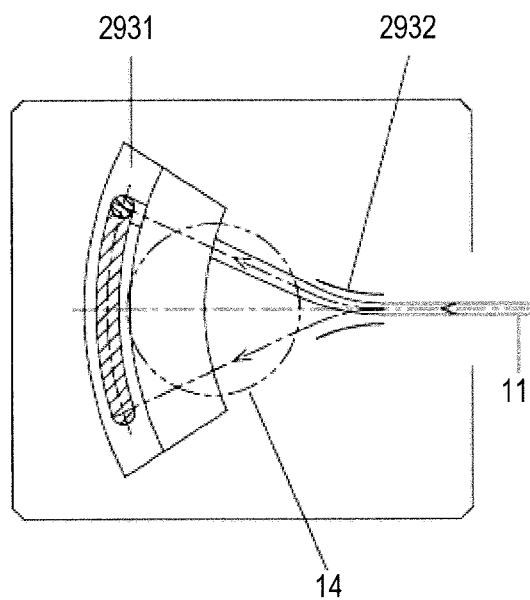
FIG. 31 is another cross-section of the implant system of FIG. 29.
Figure 38:
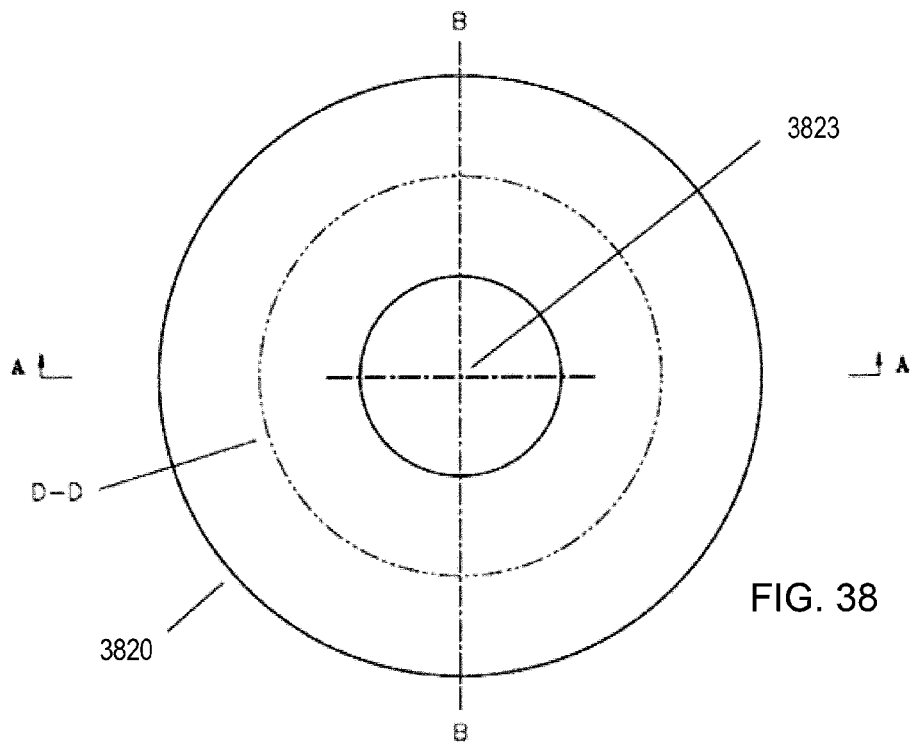
FIGS. 38, 39, and 40 illustrate the deflector of FIG. 29.
Figure 39:
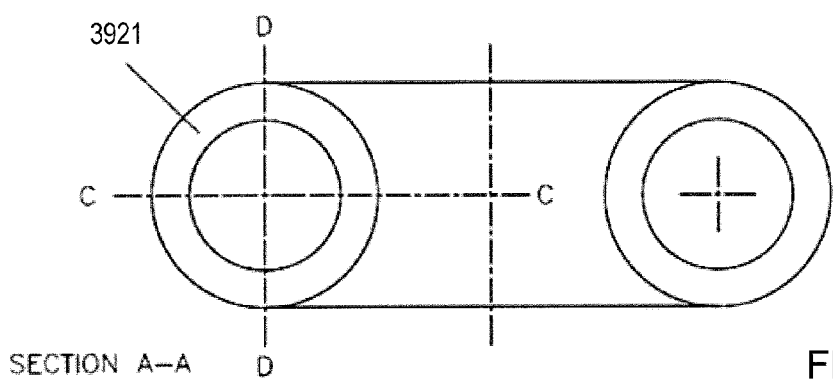
Figure 40:
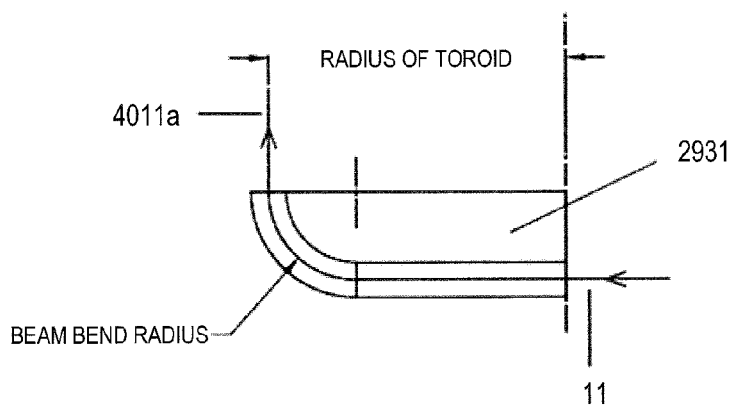

Apparatus 2900 includes beam scan electrodes 2932 (for example, a pair of parallel electrode plates) positioned around ion beam 11, between resolving aperture 2916 and a deflector 2931. Deflector 2931 may differ from deflector 53 of FIGS. 5*a* and 5*b*. In one aspect, deflector 2931 is formed with two pairs of parallel nested electrode plates which are shaped as sections of toroidal surfaces of predetermined radii. The form of deflector 2931 is clarified in FIGS. 38, 39, and 40. FIG. 38 represents a doughnut or toroid shaped metal tube 3820 centered at point 3823. A section A-A through tube 3820 reveals a second nested tube 3921 that is symmetrical with toroid shaped metal tube 3820, as shown in FIG. 39. If toroid shaped metal tubes 3820 and 3921 are cut through planes A-A, B-B, C-C, and cylindrical surface D-D a sector of the toroid assembly representing deflector 2931 is left, as shown in FIG. 40 deflecting beam 11 through 90° to form beam 4011*a*. In this simplified explanation, the resulting sector is illustrated as ninety degrees, although a smaller angle sector is shown in FIG. 31. Alternatively, deflector 2931 includes a pair of nested conical plates with the front plate gridded or slotted to let the beam in and out form an elongated, curved electrostatic mirror.

A variable electric field is generated between beam scan electrodes 2932, to scan ion beam 11 in a first direction normal to the axis of the beam 11 in a plane parallel to surface D-D. The scan centroid is located at the center point 3823 of the toroid deflector 2931. Deflector 2931 is shown deflecting beam 11 to three different positions, 11*a*, 11*b*, and 11*c*. Deflector 2931 deflects beam 11 such that beam 11*a/b/c* emerges from deflector 2931 in an arcuate scan-line of radius determined by the radius of the toroidal surfaces, provided that it is deflected by precisely 90 degrees by deflector 2931 and that it enters deflector 2931 along a radius of the toroidal surfaces in the plane of the first direction. This condition may be maintained at all times throughout the scan by beam scan electrodes 2932, illustrated in FIGS. 30 and 31. A slit valve 2924 is a vacuum valve with a slit opening matching the size of wafers and which operates to isolate loadlock 19 from atmosphere.

Figure 30:
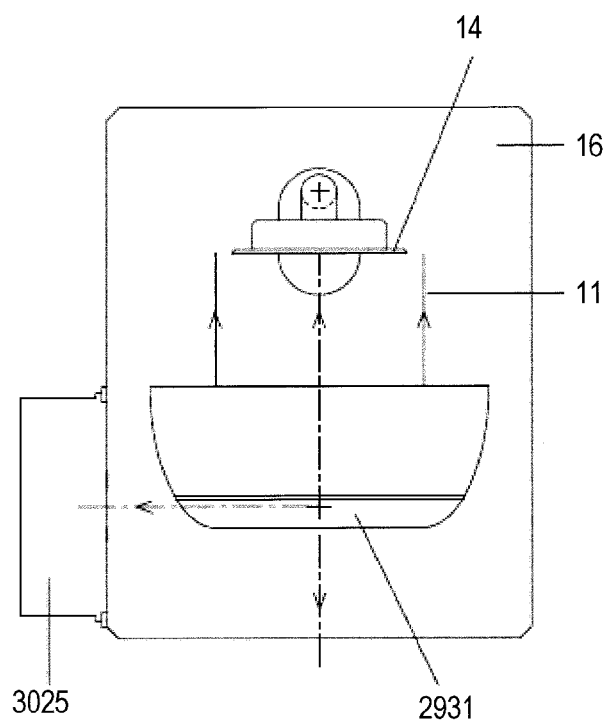
FIG. 30 is a cross-section of the implant system of FIG. 29.

FIGS. 30 and 31 are cross-sections through beam deflector 2931 and beam scan electrodes 2932. In particular, FIG. 30 is a cross-section in the direction A-A shown in FIG. 29. FIG. 31 is a section in the direction B-B shown in FIG. 29. The shaded area in FIG. 31 indicates passage of ion beam 11 as it exits deflector 2931. Position of wafer chuck 14 is shown in dotted outline. Beam scan electrodes 2932 provide for scanning of ion beam 11 in a first direction. Translation of deflector 2931 and beam scan electrodes 2932 along the axis of incoming beam 11 facilitate scanning of beam 11 in a second direction. In this embodiment, rotation of deflector 2931 is not necessary. However, a rotational drive (e.g., linear and rotational drive mechanism 55) may be included to direct beam 11 to different target wafers positioned around deflector 2931 or to a beam dump 3025.

Figure 32:
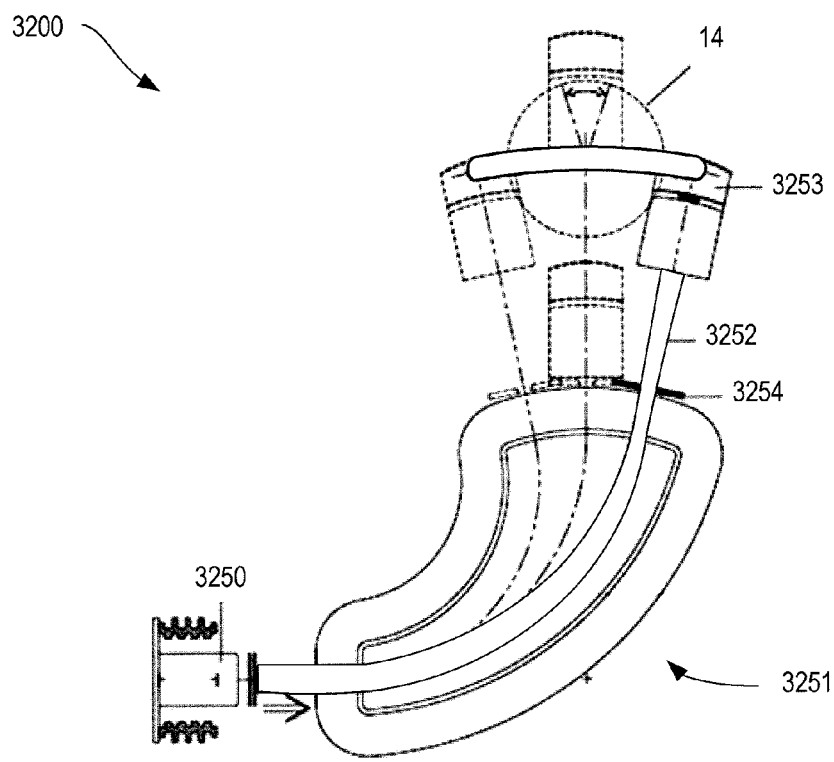
FIG. 32 is a schematic illustration of a scanning system, according to an embodiment.
Figure 33:
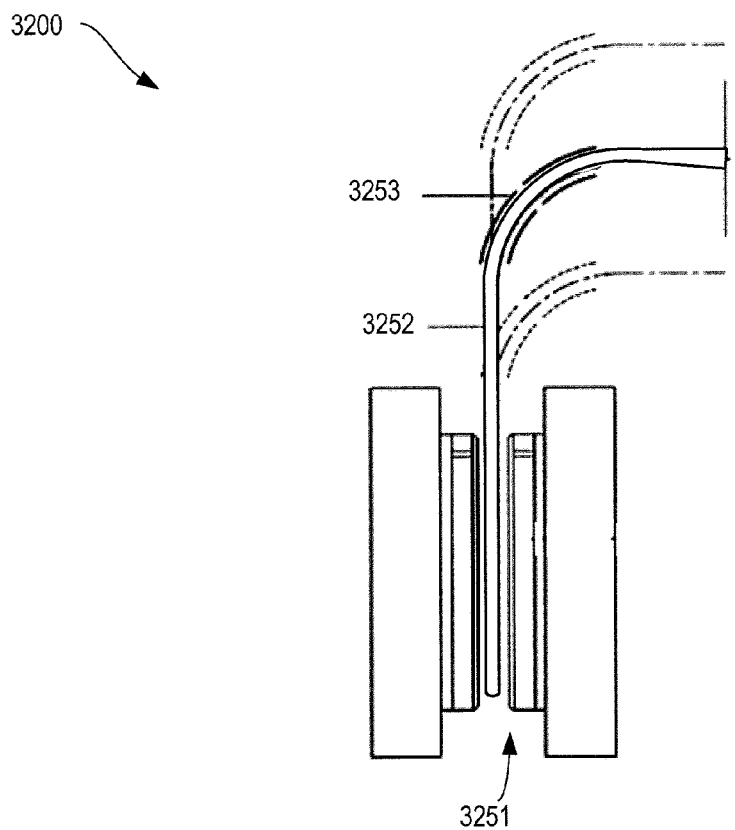
FIG. 33 is a cross-section of the scanning system of FIG. 32.

FIGS. 32 and 33 show an alternative beam scanning arrangement 3200, according to an embodiment. FIG. 32 schematically shows an ion beam source 3250 producing an ion beam 3252. FIG. 33 is a cross-section of arrangement 3200. Ion beam 3252 leaves ion beam source 3250 and enters a magnetic beam scanner 3251. Ion beam 3252 passes through a magnetic field inside magnetic beam scanner 3251, and is deflected by the magnetic field. Different magnetic field strengths deflect ion beam 3252 through different angles. The magnetic beam scanner 3251 includes an electromagnet or electromagnets which can be electrically controlled. By altering the magnetic field in beam scanner 3251, ion beam 3252 may be scanned through an angular range in a first plane.

Scanned ion beam 3252 leaves magnetic scanner 3251, passes through a resolving aperture 3254 and enters a deflector 3253. In one aspect, deflector 3253 has two pairs of electrode plates (described with reference to FIGS. 5a and 5b) and acts to deflect ion beam 3252 out of the first plane. Deflector 3253 is moveable to and from magnetic scanner 3251 along the line of emergent ion beam 3252, to provide scanning. In order to align with emergent ion beam 3252, both resolving aperture 3254 and deflector 3253 are moveable in an arc. The movement of deflector 3253 and resolving aperture 3254 is electronically controlled in conjunction with the magnetic field in scanner 3251. Magnetic scanner 3251, for example, provides a fast scan while the mechanical radial movement of deflector 3253 provides for slow scanning.

Figure 34:
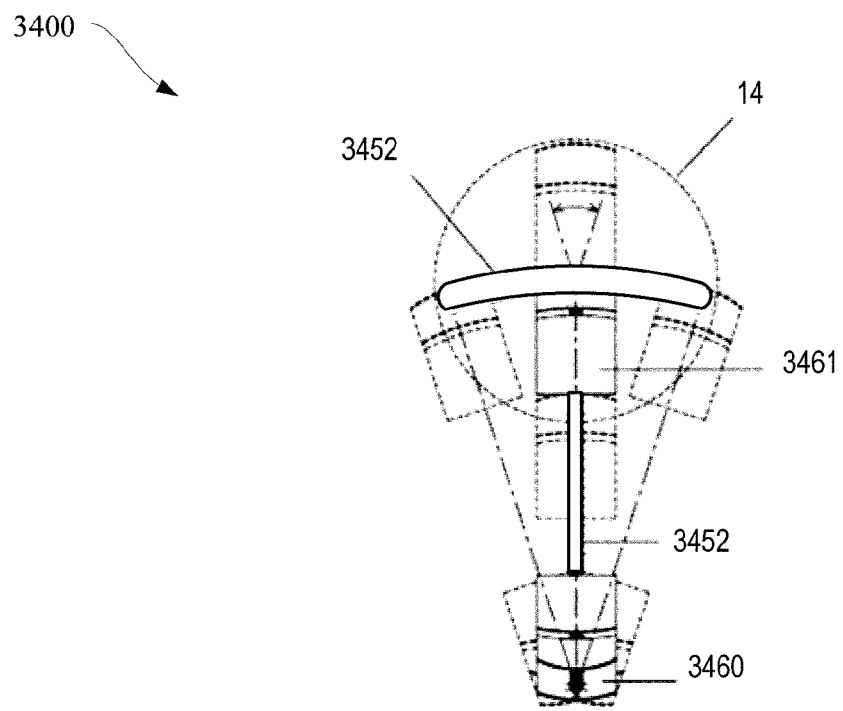
FIG. 34 is a schematic illustration of a scanning system, according to an embodiment.

FIG. 34 depicts a beam scanning arrangement 3400, according to an embodiment. Scanning arrangement 3400 includes two deflectors 3460, 3461 of the type described with reference to deflector beam deflector assembly 53, FIG. 5a. First deflector 3460 is rotatable about incoming ion beam 3452. First deflector 3460 has two pairs of parallel plates, which are, for example, sections from the surface of a sphere of a predetermined radius. First deflector 3460 is shown in different positions, indicated by dotted outline, when rotated about an axis of rotation. Target wafer chuck 14 is also shown.

Figure 35:
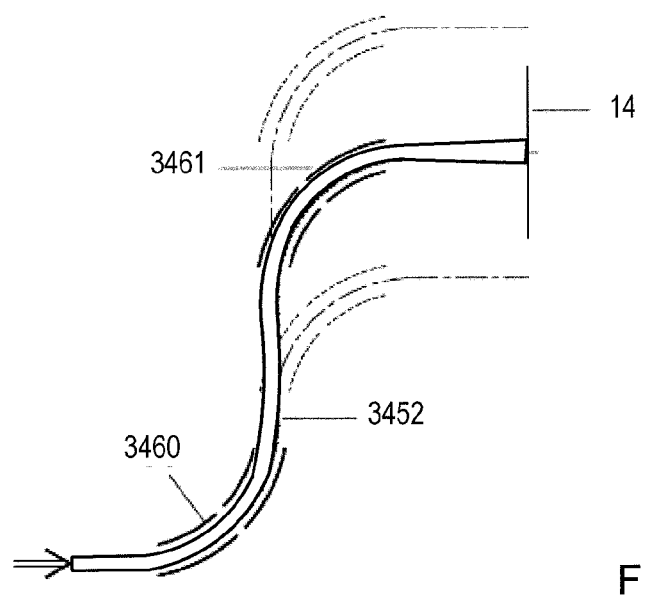
FIG. 35 is a cross-section of the scanning system of FIG. 34.

Second deflector 3461 is shown in a central position in full line, and additionally illustrated in four alternative positions, by dotted lines. Second deflector 3461 is translatable to and from first deflector 3460, parallel to ion beam 3452 output from first deflector 3460. An electric potential is set up across the pairs of plates to provide an electric field, which deflects on ion beam 3452 through 90° so that it travels parallel to its initial direction, as is shown in FIG. 35. As shown, both first and second deflectors 3460 and 3461 deflect the ion beam through 90°. However, deflectors 3460 and 3461 may deflect ion beam 3452 through other angles and still provide a two dimensional parallel scan.

FIG. 35 shows first and second deflectors 3460, 3461 in cross-section. First and second deflectors 3460, 3461 are each shown as two pairs of parallel electrode plates. Alternative positions of second deflector are illustrated by dotted lines. Second deflector 3461 may be mounted on a track (not shown) connected with first deflector 3460. The track and second deflector 3461, for example, rotate with the first deflector 3460. Second deflector 3461 may be moved to and from first deflector 3460 along the track using any suitable driving means, such as a linear motor. Alternatively, deflectors 3460 and 3461 may be magnetic. For example, a magnetic deflector 3460 may be useful with low energy beams.

Figure 36:
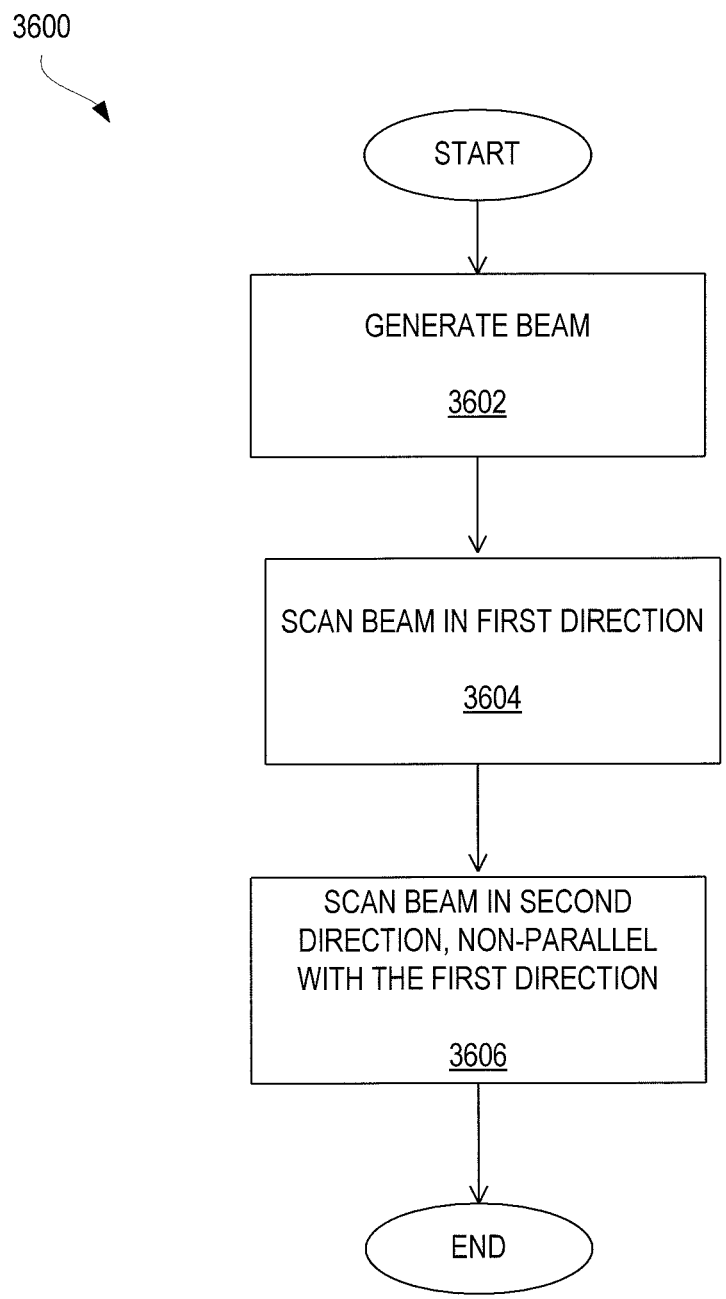
FIG. 36 is a flow chart illustrating a method of scanning a beam of charged particles in two non-parallel directions according to an embodiment.

FIG. 36 illustrates a method 3600 for scanning a beam of charged particles in two non-parallel directions. In step 3602, a beam of charged particles is generated. For example, ion beam source 10 and injector assembly 2911 of ion implant apparatus 2900, FIG. 29, form and discharge ion beam 11. In step 3604, the beam of charged particles is scanned in a first direction. In one example of step 3604, beam 11 is scanned across the surface of a wafer held in wafer chuck 14. In step 3606, the beam is scanned in a second direction, non-parallel with the first direction. For example, deflector 2913 is translated and/or rotated via drive mechanism 55 to deflect beam 11 and scan the beam in the second direction.

Figure 37:
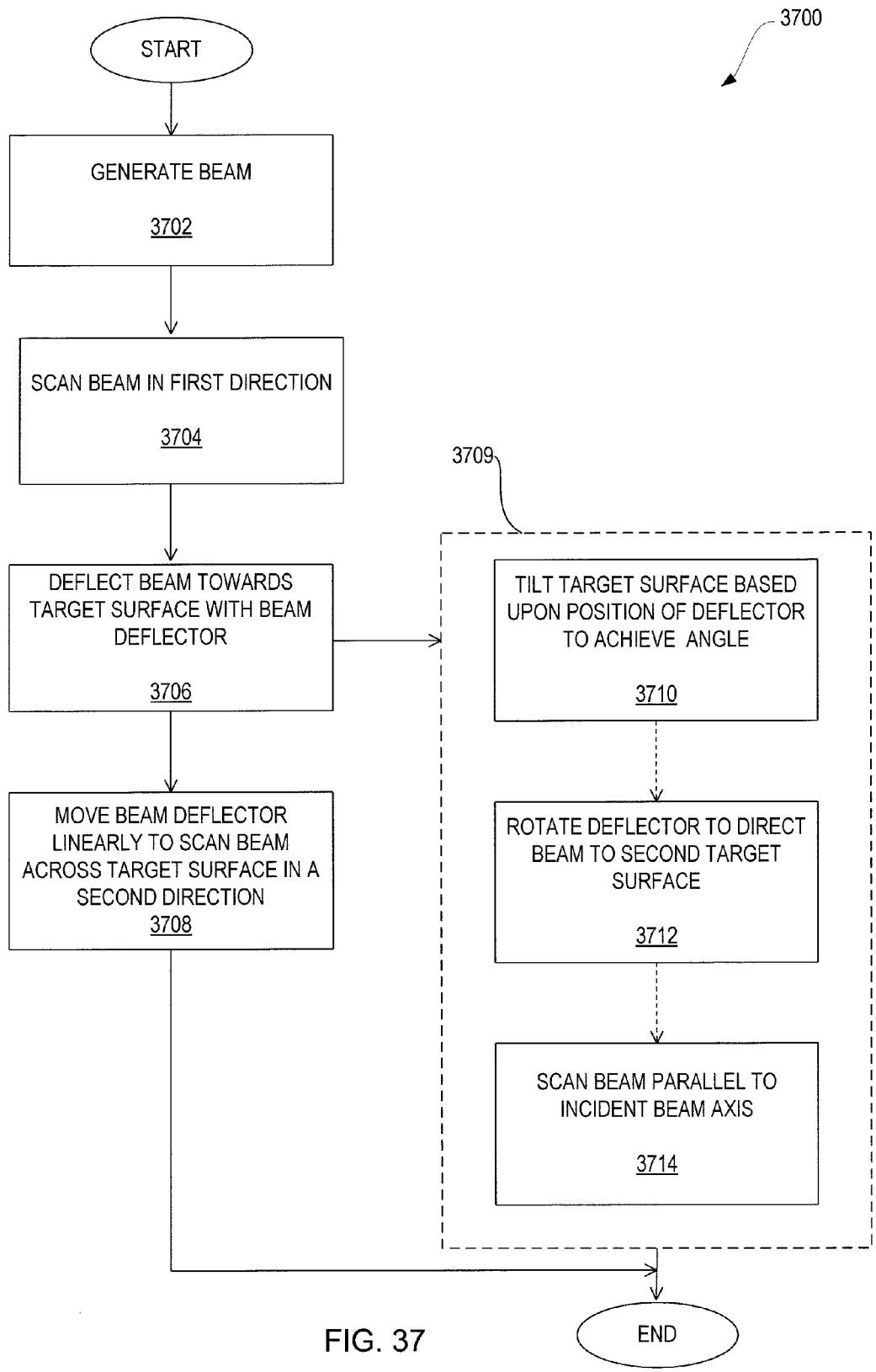
FIG. 37 is a flow chart showing a method for multi-directional scanning of a charged particle beam according to an embodiment.

FIG. 37 shows an exemplary method 3700 for multi-directional scanning of a charged particle beam. A charged particle beam is generated, in step 3702, and scanned in a first direction in step 3704. In one example of steps 3702, 3704 shown in FIG. 29, ion beam source 10 produces beam 11. Beam 11 is discharged from injector assembly 2911 and scanned along the beam axis. In step 3706, the beam is deflected towards a target surface, using a beam deflector. For example, beam 11 is received at deflector 2931, which deflects the beam towards the surface of a wafer held in wafer chuck 14. In step 3708, the deflector is moved linearly to scan the beam across the target surface, in a second direction. In one example of step 3708, drive mechanism 55 is actuated to rotate deflector 2931 and re-direct beam 11 across the surface of a wafer held at chuck 14.

Steps 3710-3714 are optional, as indicated by dotted box 3709. In step 3710, the target surface is tilted based upon deflector position, to achieve a desired angle of incidence between the beam and the target surface. In one example of step 3710, tilting drive 17 tilts wafer chuck 14 to change position of a wafer held therein, according to a desired angle of incidence.

In steps 3712 and 3714, the deflector is rotated to direct the beam to a second target surface, and the beam is scanned parallel to the incident beam axis. In one example of steps 3712 and 3714, deflector 2931 is rotated via drive mechanism 55, to direct beam 11 to a second target surface, and beam 11 is then scanned across the target surface in a direction parallel to the axis of incident beam 11.

It will be understood that certain changes may be made in the above systems and methods without departing from the scope hereof. Thus, it is intended that all matters contained in the above description or shown in the accompanying drawings are to be interpreted as illustrative and not in a limiting sense. One of ordinary skill in the art will appreciate that similarly named parts in the above embodiments may represent parts having similar structure and functionality, unless otherwise described herein. For example, ion beam source 10, FIG. 1, may be similar to ion beam sources 810, 1110, 1440 and 2610 of FIGS. 8a, 11, 14 and 26, respectively. It is also to be understood that the following claims are to cover generic and specific features described herein, and all statements of the scope of the invention which, as a matter of language, might be said to fall therebetween.

What is claimed is:

1. An apparatus for multi-directionally scanning a beam of charged particles across a target surface, comprising:
   a beam source for producing a beam of charged particles along an incident beam axis;
   a beam scanner for scanning the beam in a first direction across the target surface;
   a beam deflector disposed along the incident beam axis, for deflecting the beam of charged particles; and
   an actuator coupled with the beam deflector, for moving the beam deflector in a second direction, to provide beam scanning in the second direction across the target surface.

2. The apparatus of claim 1, further comprising a wafer holder for holding a target wafer having the target surface, the wafer holder configured for tilting the wafer to facilitate impingement of the beam upon the target surface.

3. The apparatus of claim 2, further comprising a tilt controller for controlling tilt of the wafer as a function of a rotational position of the beam deflector, to maintain a predetermined angle between the beam of charged particles and the target surface throughout a scan.

4. The apparatus of claim 1, wherein the actuator rotates to rotate the beam deflector, to scan in the second direction.

5. The apparatus of claim 4, further comprising a first wafer holder and a second wafer holder, the actuator configured for rotating the beam deflector to selectively direct the beam of charged particle beam towards the first wafer holder or the second wafer holder.

6. The apparatus of claim 1, wherein the actuator moves the beam deflector linearly.

7. The apparatus of claim 1, wherein the first direction is substantially parallel to the incident beam axis.

8. The apparatus of claim 1, the deflector comprising an electrostatic deflector having a spherical plate inflector separated into two sections.

9. The apparatus of claim 8, the sections comprising a pair of parallel, curved electrically conductive plates.

10. The apparatus of claim 9, further comprising:
    a current source for applying a potential difference between the plates, to produce an electric field for deflecting the charged particle beam at a predetermined angle;
    a series of individually controllable deflecting elements arranged along a beam path aligned with the deflector; and
    a control means coupled to each of the deflecting elements, for controlling the deflecting elements to sweep the beam of charged particles across the target surface.

11. The apparatus of claim 1, the deflector comprising a magnetic deflector for controlling beam deflection by subjecting the beam to a variable magnetic field.

12. The apparatus of claim 1, the deflector comprising a pair of nested conical plates forming an electrostatic mirror, a front plate of the pair being gridded or slotted to facilitate passage of the beam therethrough.

13. The apparatus of claim 1, further comprising an analyzer magnet and a resolving aperture, for cooperatively selecting an ion species for the charged particle beam.

14. An apparatus for multi-directional charged particle beam scanning, comprising:
    a beam source for producing a beam of charged particles along an incident beam axis;
    a beam deflector for deflecting the beam;
    a linear actuator for moving the beam deflector along the incident beam axis; and
    a rotation drive mechanism coupled with the beam deflector, for rotating the beam deflector about the incident beam axis.

15. The apparatus of claim 14, further comprising:
    a beam scanner for scanning the beam of charged particles in a first direction; and
    electrodes disposed with the beam deflector and extending in the first direction, for receiving the beam throughout scanning and to deflect the beam of charged particles.

16. A method for multi-directional scanning of a charged particle beam, comprising the steps of:
    generating a beam of charged particles along an incident beam axis;
    scanning the beam of charged particles in a first direction;
    deflecting the beam of charged particles towards a wafer surface, using a beam deflector; and
    moving the beam deflector to scan the beam of charged particles across the wafer surface, in a second direction.

17. The method of claim 16, wherein moving the beam deflector comprises one or both of (a) linearly translating the deflector, and (b) rotating the deflector.

18. The method of claim 17, further comprising the step of tilting the wafer surface depending on a rotational position of the beam deflector, to maintain impingement of the charged particles upon the wafer surface at a predetermined angle throughout a scan.

19. The method of claim 17, further comprising tilting the wafer surface based upon deflector position, to achieve a desired angle of incidence between the wafer surface and the beam.

20. The method of claim 16 further comprising:
    rotating the beam deflector to direct the beam to a second target surface; and
    moving the beam deflector to scan the beam across the second target surface.

21. The method of claim 20, wherein scanning the beam in the second direction comprises scanning in a direction substantially parallel to the incident beam axis.

* * * * *